(12) United States Patent
Ricci et al.

(10) Patent No.: US 10,209,308 B2
(45) Date of Patent: Feb. 19, 2019

(54) MV SWITCHING DEVICE OF THE ELECTROMAGNETIC TYPE HAVING AN IMPROVED POWER DRIVE CIRCUIT

(71) Applicant: ABB Technology AG, Zurich (CH)

(72) Inventors: Andrea Ricci, Dalmine (IT); Gabriele Valentino De Natale, Milan (IT); Marco Testa, Dalmine (IT)

(73) Assignee: ABB SCHWEIZ AG, Baden (CH)

( * ) Notice: Subject to any disclaimer, the term of this patent is extended or adjusted under 35 U.S.C. 154(b) by 523 days.

(21) Appl. No.: 14/957,723

(22) Filed: Dec. 3, 2015

(65) Prior Publication Data

US 2016/0161559 A1    Jun. 9, 2016

(30) Foreign Application Priority Data

Dec. 5, 2014 (EP) .................................... 14196495

(51) Int. Cl.
*G01R 31/327* (2006.01)
*H01H 3/32* (2006.01)
(Continued)

(52) U.S. Cl.
CPC ........... *G01R 31/3275* (2013.01); *H01H 3/32* (2013.01); *H01H 47/002* (2013.01);
(Continued)

(58) Field of Classification Search
CPC .......... G01R 31/3275; G01R 31/32375; H02H 3/08; H02H 7/1225; H01H 50/64;
(Continued)

(56) References Cited

U.S. PATENT DOCUMENTS 5,153,487 A    10/1992  Hennig
5,510,725 A *   4/1996  Schantz, Jr. ............ B60L 3/003
                                                          324/537
(Continued)

FOREIGN PATENT DOCUMENTS

CN    100552852 C    10/2009
JP    2011057012 A    3/2011

OTHER PUBLICATIONS

Communication with Extended European Search Report dated Jun. 15, 2015 in EP14196495.7.

*Primary Examiner* — Zeev V Kitov
(74) *Attorney, Agent, or Firm* — Polsinelli PC

(57) ABSTRACT

A MV switching device (100) comprising:
 one or more electric poles, each comprising a movable contact (16) and a fixed contact (17) adapted to be coupled or uncoupled during the switching operations of said switching device; and
 an electromagnetic actuator (13) operatively coupled to the movable contacts of the electric poles, said electromagnetic actuator having at least an excitation winding (152);
 power supply means (60) for supplying electric power to said electromagnetic actuator;
 a power drive circuit (1) for driving said electromagnetic actuator, said power drive circuit comprising sensing means for providing signals indicative of the currents flowing along the circuit branches of said power drive circuit and of the voltages at the terminals of said power drive circuit.

20 Claims, 16 Drawing Sheets

Figure 1:
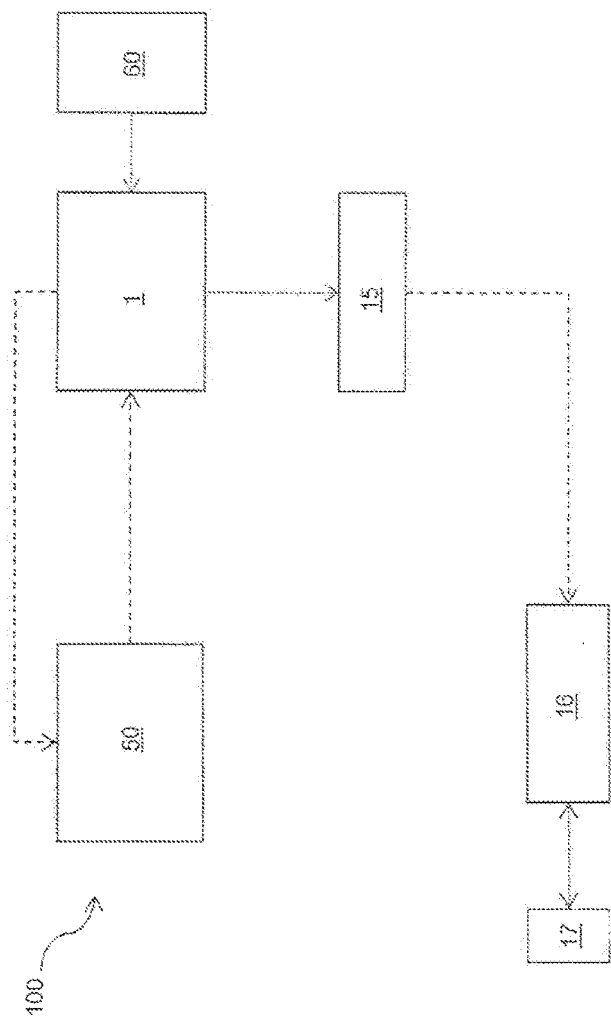

(51) Int. Cl.
  *H01H 47/00* (2006.01)
  *H01H 50/44* (2006.01)
  *H01H 50/64* (2006.01)
  *H02P 29/024* (2016.01)
  *H02H 7/122* (2006.01)
  *H02H 3/08* (2006.01)

(52) U.S. Cl.
  CPC ............ *H01H 50/44* (2013.01); *H01H 50/64* (2013.01); *H02H 7/1225* (2013.01); *H02P 29/027* (2013.01); *H02H 3/08* (2013.01)

(58) Field of Classification Search
  CPC ........ H01H 50/44; H01H 3/32; H01H 47/002; H02P 29/027
  See application file for complete search history.

(56) References Cited

U.S. PATENT DOCUMENTS

| | | | |
|---|---|---|---|
| 5,959,826 A | | 9/1999 | Baurand et al. |
| 6,967,454 B1 * | | 11/2005 | Braun .................... H02P 29/02 |
| | | | 318/563 |
| 9,673,744 B2 * | | 6/2017 | Eberlein ................ H02P 27/06 |
| 2008/0315804 A1 | | 12/2008 | Nishibe et al. |
| 2009/0224711 A1 * | | 9/2009 | Sardat .................... H02M 1/44 |
| | | | 318/400.27 |

\* cited by examiner

MV SWITCHING DEVICE OF THE ELECTROMAGNETIC TYPE HAVING AN IMPROVED POWER DRIVE CIRCUIT

CROSS REFERENCE TO RELATED APPLICATIONS

This application claims priority to Application No. 14196495.7 filed in Europe on Dec. 5, 2014 under 35 U.S.C. § 119. The entire contents of this application are hereby incorporated by reference.

The present invention relates to the field of switching devices for medium voltage applications, such as circuit breakers, contactors, disconnectors, reclosers or the like.

For the purposes of the present invention, the term medium voltage (MV) identifies voltages higher than 1 kV AC and 1.5 kV DC up to tens of kV, e.g. up to 72 kV AC and 100 kV DC. More particularly, the present invention relates to a MV switching device of the electromagnetic type.

As it is known, a MV switching device of the electromagnetic type comprises an electromagnetic actuator for coupling or uncoupling its electric contacts during switching operations.

In some known MV switching devices, the electromagnetic actuator comprises a magnetic core provided with an excitation winding and a movable plunger mechanically coupled to the mobile contacts of the switching device.

In other known MV switching devices, the electromagnetic actuator comprises an electric motor (e.g. a brushless motor) having a plurality of excitation windings (stator windings).

A kinematic chain mechanically couples the electric motor with the electric contacts of the switching device, which can thus be operated between the mentioned coupling and uncoupling positions.

A MV switching device of electromagnetic type generally comprises power supply means to provide electric power to the electromagnetic actuator and a power drive circuit that is suitably arranged to drive suitable excitation currents along the excitation windings of the electromagnetic actuator, so that this latter can operate the electric contacts of the MV switching device according to the needs.

Typically, the power drive circuit comprises a network of power switches (e.g. MOSFETs or IGBTs) between the input and output terminals of the power drive circuit.

A drawback of current MV switching devices of electromagnetic type consists in that that these apparatuses are not provided with means for carrying out protection functions against faults occurring in the power drive circuit during the execution of the switching operations.

The functionalities of the electromagnetic actuator can thus be interrupted without any advice.

Further, faults occurring in the power drive circuit can easily propagate to the electromagnetic actuator with consequent relevant damages to this latter.

An additional drawback of current MV switching devices of electromagnetic type consists in that they are not provided with means for carrying out diagnostic functions on the operative status of the main components of the power drive circuit and of the excitation windings connected thereto.

It is thus quite difficult to identify and prevent possible faults before the MV switching device is requested to operate.

In the state of the art, it is thus still felt the need for technical solutions that are capable of overcoming the technical issues described above.

In order to respond to this need, the present invention provides a MV switching device according to the following claim 1 or the following claim 5 and the related dependent claims.

An important feature of MV switching device of invention consists in that it comprises a power drive circuit provided with sensing means capable of providing information on the currents circulating along the circuit branches of said power drive circuit.

Such an information may be used to implement protection functions against faults (e.g. short circuits) occurring at the internal components of the power drive circuit, in particular at the power switches thereof, during the operation of the electromagnetic actuator.

These protection functions ensure a safe operation of the power switches and, more notably, an effective protection against the propagation of faults towards the electromagnetic actuator. This latter function is quite important since it may prevent the need for expensive maintenance interventions to critical elements of the switching device, such as the excitation windings of the electromagnetic actuator and the electrical connections between the output terminals of the power drive circuit and said excitation windings.

A further important feature of MV switching device of invention consists in that the power drive circuit is further provided with sensing means capable of providing information on the currents circulating along the excitation windings of the electromagnetic actuator.

Such information may be used to implement over-current protection functions that may be easily configured depending on the operative conditions of the MV switching device.

A further important feature of MV switching device of invention consists in that the power drive circuit is further provided with sensing means capable of providing information on the voltages present at the input and output terminals of the power drive circuit.

Such information, in conjunction with the information provided by the further sensing means mentioned above, may be advantageously used to implement advanced diagnostic functions that can be cyclically carried out when the electromagnetic actuator is not operating or at the end of each switching operation.

Said diagnostic functions allows checking the actual operative status of the power switches of the power drive circuit and/or the electrical continuity of the excitation windings of the electromagnetic actuator or of the electrical connections between the output terminals of the power drive circuit and said excitation windings.

A further aspect of the present invention relates to a fault protection method in a MV switching device, according to the following claim 10 or the following claim 13.

A further aspect of the present invention relates to an over-current protection method in a MV switching device, according to the following claim 11 or the following claim 14.

A further aspect of the present invention relates to a fault determination method in a MV switching device, according to the following claim 12 or the following claim 15 and the related dependent claims.

A further aspect of the present invention relates to a power drive circuit for a MV switching device, according to the following claim 16 or the following claim 17.

Figure 2:
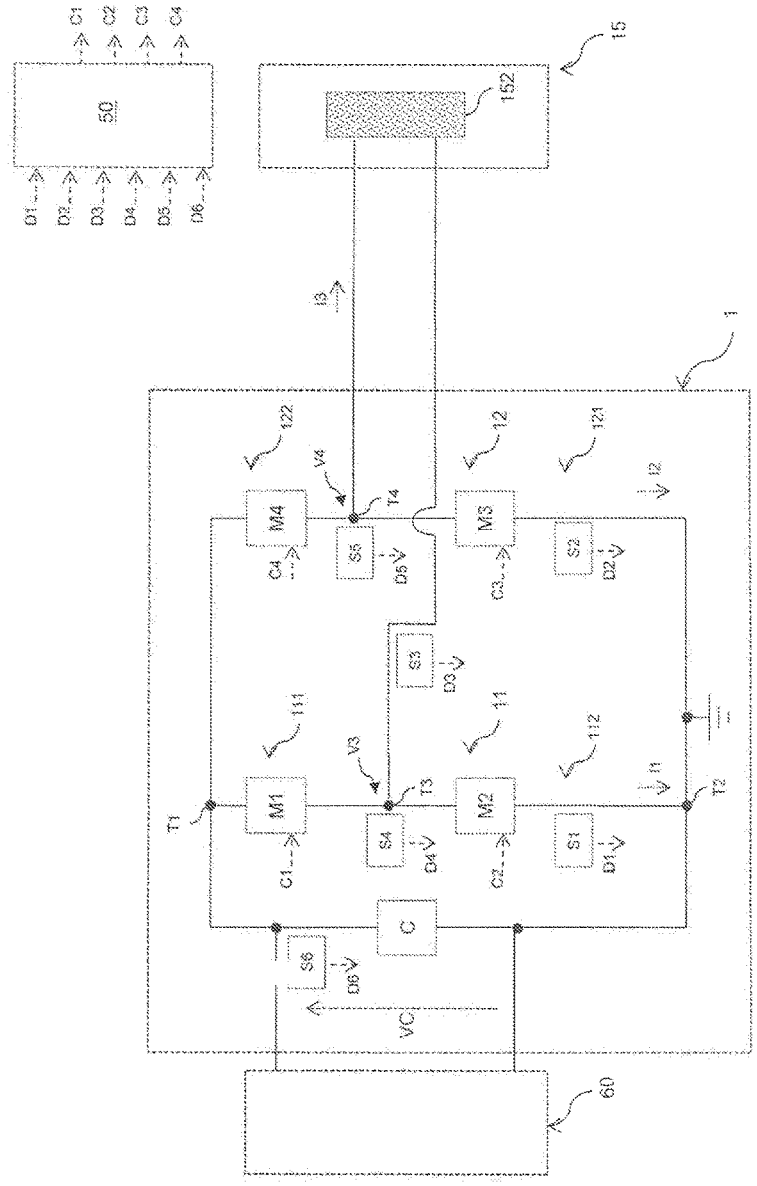
Figure 2A:
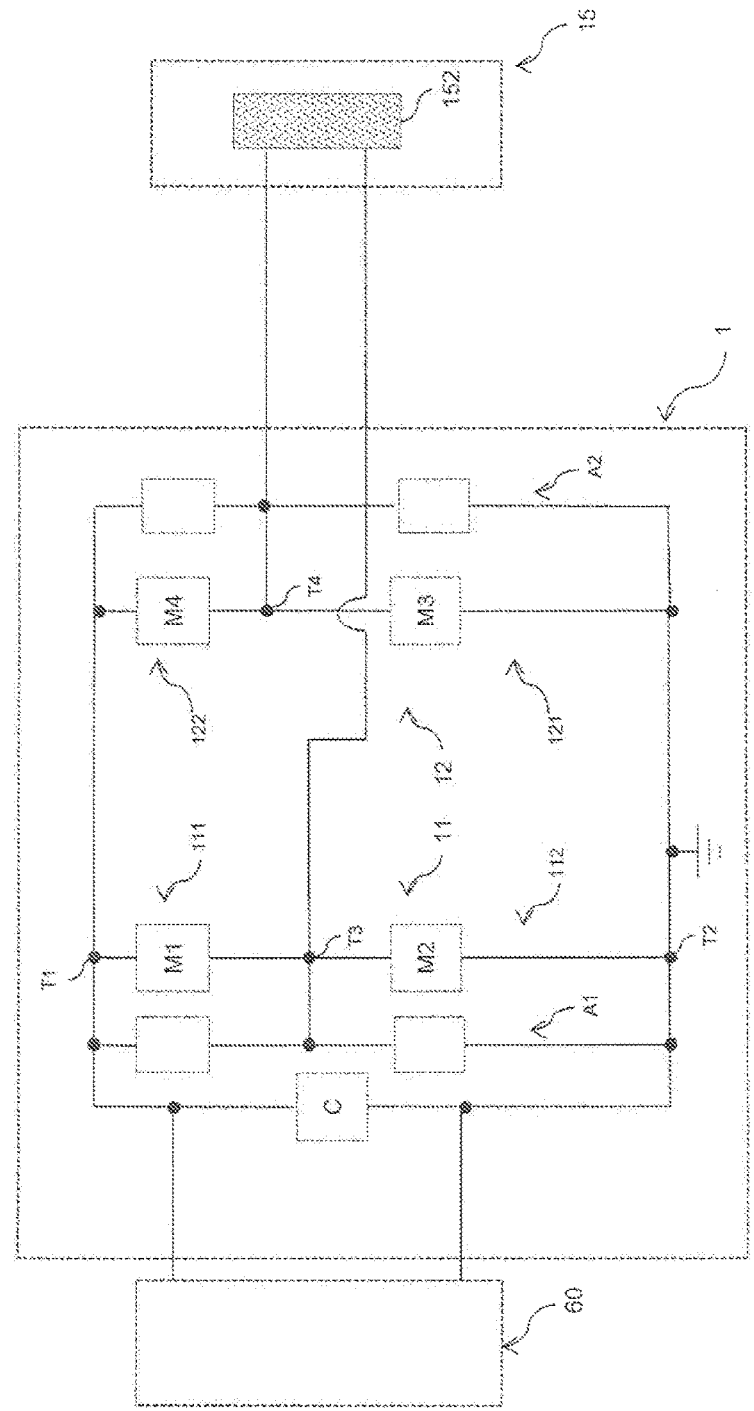
Figure 3:
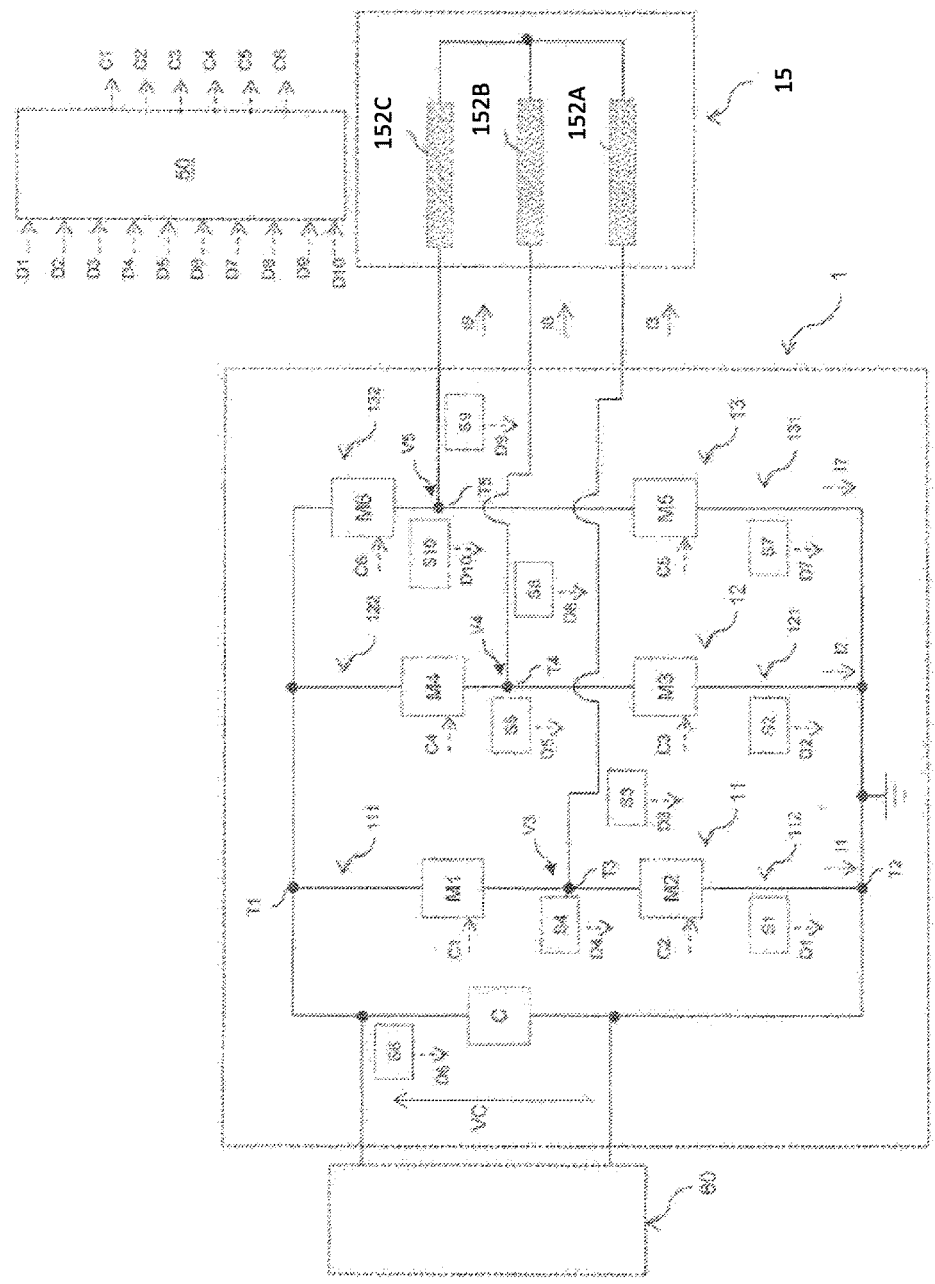
Figure 3A:
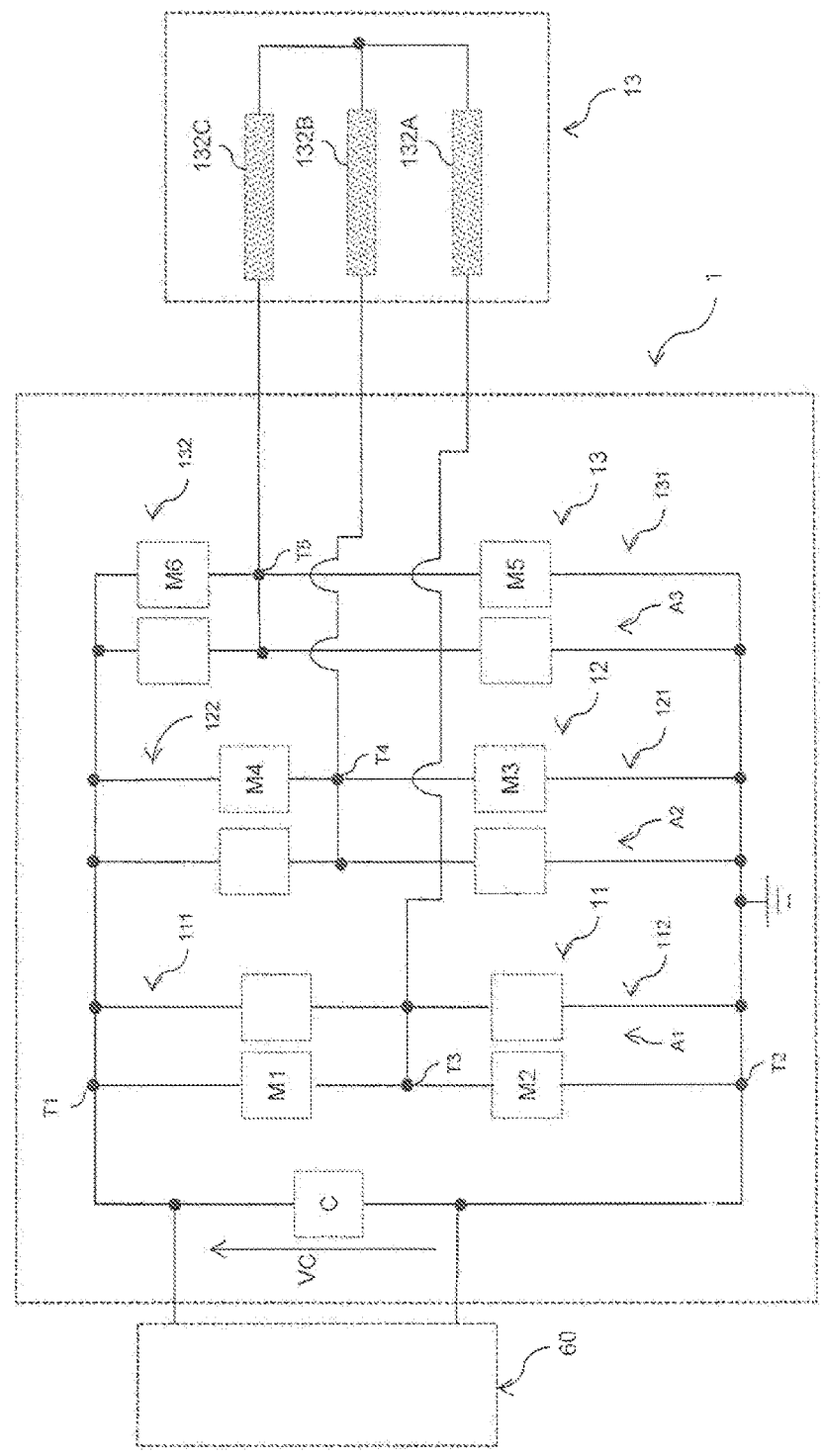
Figure 4:
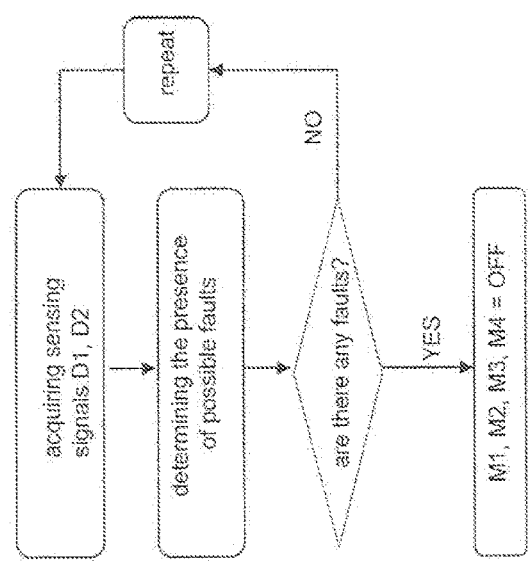
Figure 5:
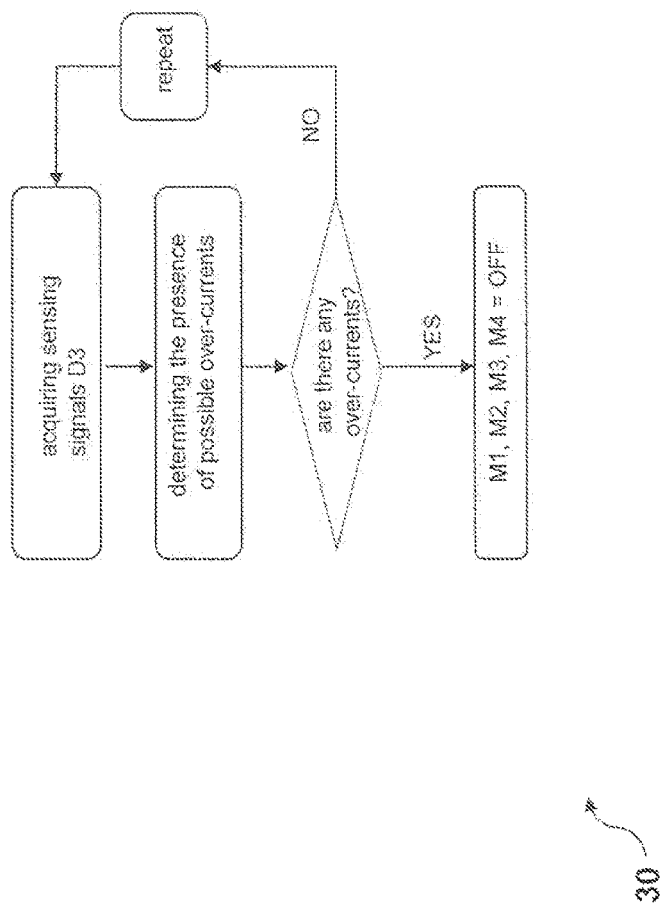
Figure 6:
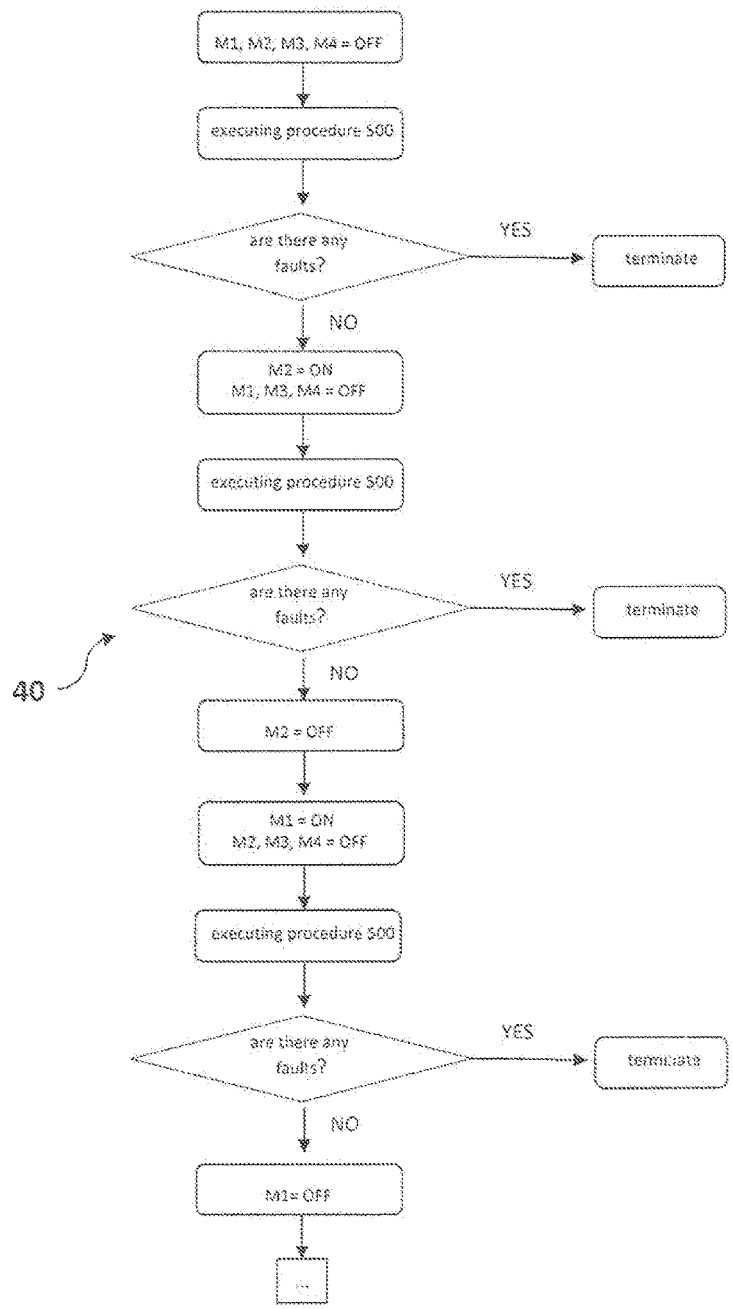
Figure 7:
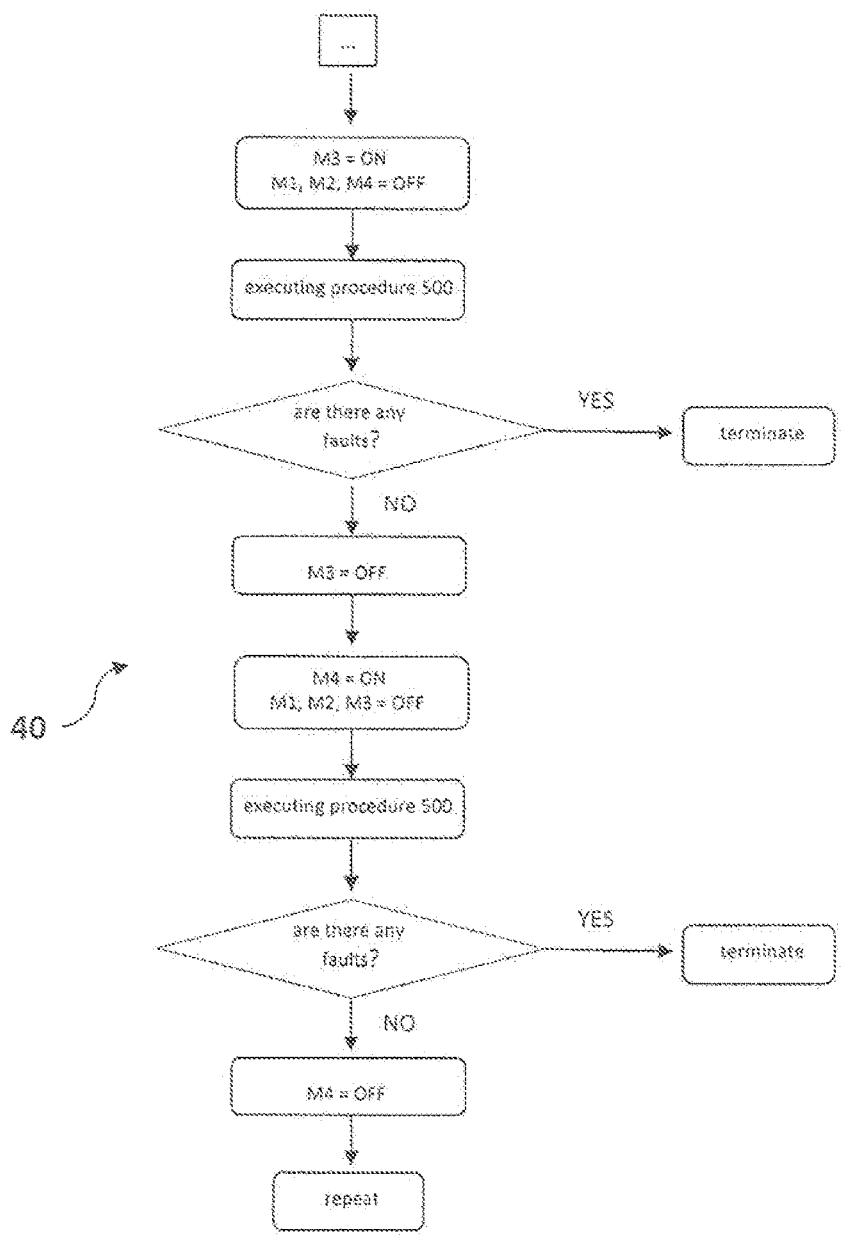
Figure 8:
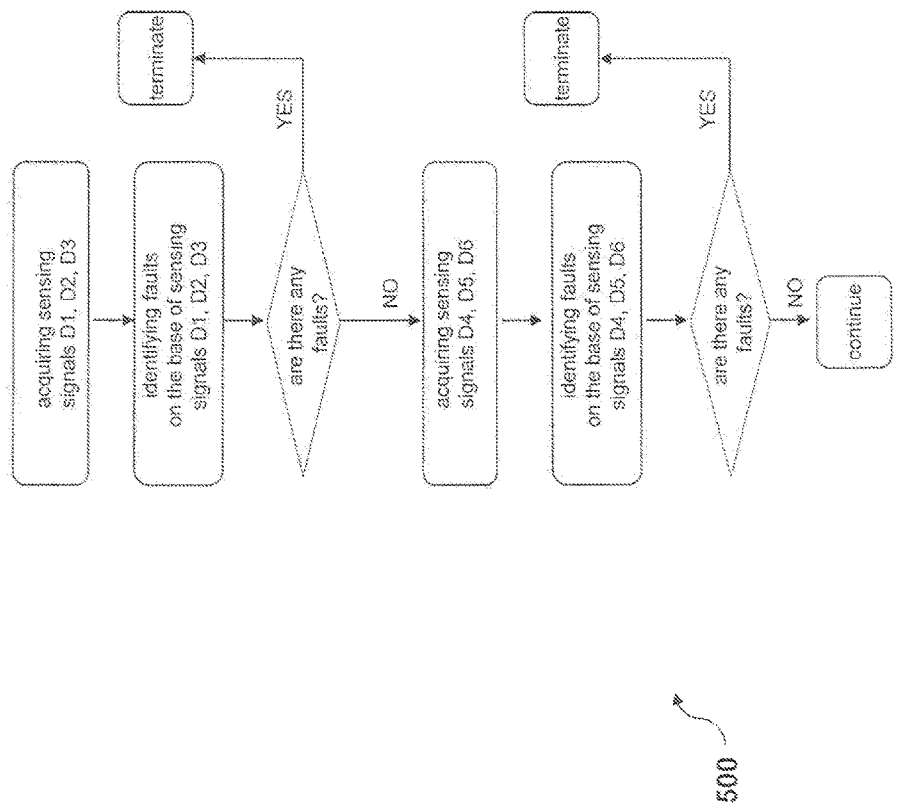
Figure 9:
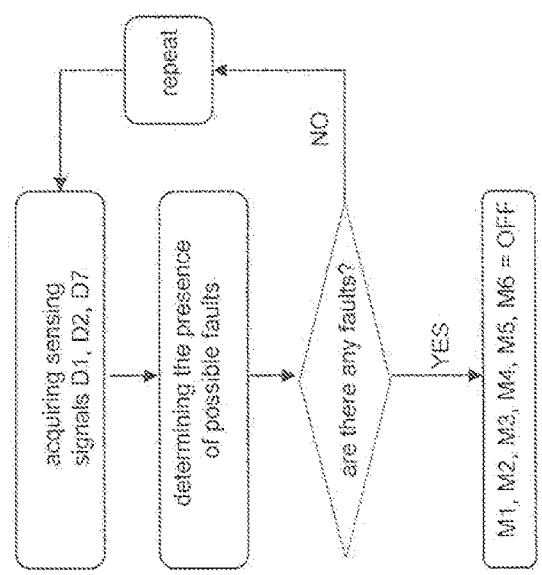
Figure 10:
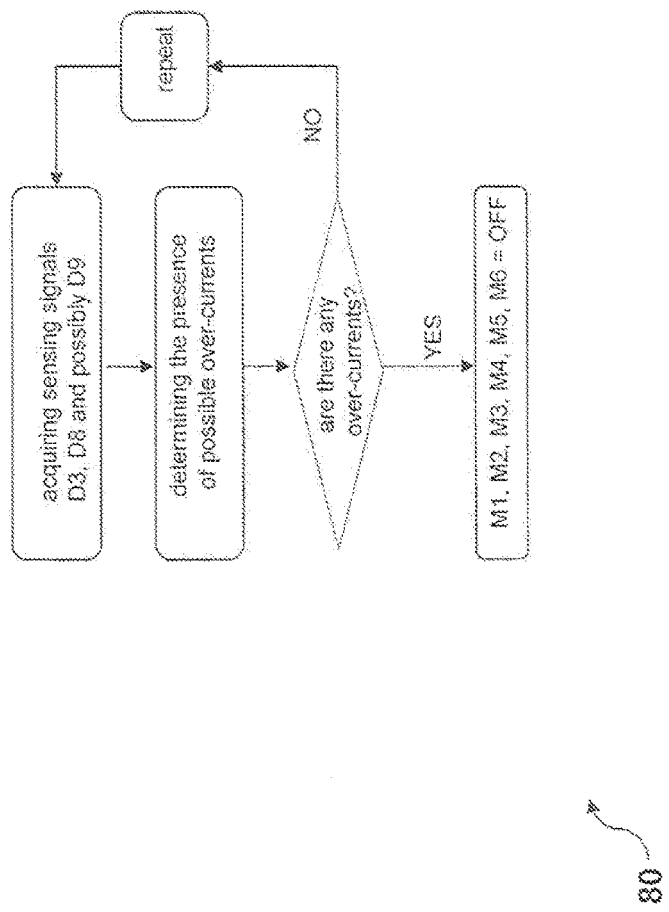

Further characteristics and advantages of the present invention will become more apparent from the detailed description of preferred embodiments illustrated only by way of non-limitative example in the accompanying drawings, in which:

FIG. 1 schematically shows a MV switching device of the invention;

FIGS. 2, 2A schematically show the power drive circuit of an embodiment of the MV switching device of the invention;

FIGS. 3, 3A schematically show the power drive circuit of a further embodiment of the MV switching device of the invention;

FIG. 4 schematically shows a fault protection method that can be executed in the MV switching device of FIGS. 1 and 2, 2A;

FIG. 5 schematically shows an over-current protection method that can be executed in the MV switching device of FIGS. 1 and 2, 2A;

FIGS. 6-8 schematically show a fault determination method that can be executed in the MV switching device of FIGS. 1 and 2, 2A;

FIG. 9 schematically shows a fault protection method that can be executed in the MV switching device of FIGS. 1 and 3, 3A;

FIG. 10 schematically shows an over-current protection method that can be executed in the MV switching device of FIGS. 1 and 3, 3A;

FIGS. 11-14 schematically show a fault determination method that can be executed in the MV switching device of FIGS. 1 and 3, 3A.

Referring to FIG. 1, the present invention is related to a MV switching device 100.

The switching device 100 comprises one or more electric poles, each of which comprises a movable contact 16 and a fixed contact 17, which are electrically connectable to a conductor (e.g. a phase conductor) of a power distribution line (not shown).

The electric contacts 16-17 are configured to be coupled or uncoupled respectively during the switching operations of the switching device 100.

A switching operation may be a closing operation, in which the contacts 16, 17 are brought from an uncoupled state to a coupled state, or an opening operation, in which the contacts 16, 17 are brought from a coupled state to an uncoupled state.

When the contacts 16, 17 are in a coupled or uncoupled state, the switching device 100 is respectively in a closing or an opening condition.

The switching device 100 comprises an electromagnetic actuator 15 that comprises one or more excitation windings.

In some embodiments of the invention (FIG. 2), the electromagnetic actuator 15 may be a known actuator of the SCA (Single Coil Actuator) type, such as the one described in the patent application EP2312605A1.

In this case, the electromagnetic actuator 15 comprises at least an excitation winding 152, a magnetic core (not shown) and a movable plunger (not shown) that is operatively coupled to each movable contact 16 of each electric pole through a kinematic chain (not shown).

During a switching operation of the switching device 100, an excitation current circulates in the excitation winding 152 in order to generate a magnetic flux.

Advantageously, the excitation winding 152 is coiled around the magnetic core 131 that properly directs the streamlines of the magnetic flux generated by the excitation current.

The movable plunger is operated by a force generated by the magnetic flux enchained with the magnetic core and the movable plunger.

During a switching operation of the switching device 100, the movable plunger is operated between two positions, which correspond to a coupled state or uncoupled state of the electric contacts 16, 17 and, therefore, to a closing or opening condition of the switching device 1.

In other embodiments of the invention (FIG. 3), the electromagnetic actuator 15 may be a known three-phase electric motor, preferably of the brushless type.

In this case, as shown in FIG. 3, the electromagnetic actuator 15 comprises three excitation windings 152A, 152B, 152C that form the stator windings of the electric motor.

The switching device 100 advantageously comprises power supply means 60 that supply electric power to the electromagnetic actuator 15 during a switching operation.

The power supply means 60 may be of known type.

The switching device 100 comprises a power drive circuit 1 for driving the electromagnetic actuator 15 during the switching operations of the switching device 100.

In particular, the power drive circuit 1 is configured to receive electric power from the power supply means 60 and provide suitable excitation currents to the excitation windings of the electromagnetic actuator 15 for the operation of this latter.

Preferably, the switching device 100 comprises control means 50 for controlling the switching operations thereof.

The control means 50 are operatively associated (e.g. by suitable electrical wirings or in other known manners) to the power supply means 60, so that they can exchange control/data signals with the latters.

The control means 50 are operatively associated (e.g. by suitable electrical wirings or in other known manners) to the power drive circuit 1, so that they can exchange control/data signals with this latter.

As an example, when a switching operation (i.e. a closing or an opening operation) has to be executed, the control means 50 send control signals to one or more power switches of the power drive circuit 1 so that this latter provides suitable excitation currents to operate the electromagnetic actuator 15.

Preferably, the control means 50 are configured to directly control the power drive circuit 1 and are physically integrated with this latter in a control unit controlling the operation of the switching device 1.

Other solutions are possible, according to the needs.

For example, the control means 50 can be physically separated from the power drive circuit 1.

As a further example, the power drive circuit 1 may comprise a dedicated control unit that is in turn controlled by the control means 50.

Preferably, the control means 50 comprises a computerized unit (such as a microprocessor) configured to execute software instructions to generate control/data signals to manage the operating life of the switching device 100, in particular the operation of the power drive circuit 1.

FIGS. 2, 2A refer to an embodiment of the invention in which the electromagnetic actuator 15 is of the SCA type and comprises an excitation winding 152.

According to this embodiment, the power drive circuit 1 comprises first and second input terminals T1, T2 electrically connected to the power supply means 60 through electrical connections of known type.

The terminals T1, T2 advantageously form an input port through which the power drive circuit 1 receives the electric power needed to provide excitation currents to the electromagnetic actuator 15.

Preferably, the power drive circuit 1 comprises at least a storage capacitor C electrically connected in parallel to the input terminals T1, T2 and configured to store electrical energy to operate the electromagnetic actuator.

In normal conditions, the storage capacitor C is continuously charged by the power supply means 60 and is in turn capable of continuously feeding the remaining circuit sections of the power drive circuit 1.

In emergency conditions (e.g. due to a fault), the storage capacitor C is no more charged and it thus capable of providing electric power for a residual time interval only, during which the electromagnetic actuator 15 can execute an emergency maneuver.

In the embodiment shown in FIG. 2, the power drive circuit 1 comprises at least a first output terminal T3 and a second output terminal T4 electrically connected to the excitation winding 152 of the electromagnetic actuator 15.

The power drive circuit 1 has substantially a H-bridge circuit configuration.

The power drive circuit 1 comprises a first circuit branch 11, which is electrically connected between the input terminals T1, T2 and comprises the output terminal T3.

The circuit branch 11 comprises a first circuit branch portion 111 and a second circuit branch portion 112.

The circuit branch portion 111 is arranged between the input terminal T1 and the output terminal T3 whereas the circuit branch portion 112 is arranged between the output terminal T3 and the input terminal T2.

The circuit branch portion 111 comprises a first power switch M1 (e.g. a MOSFET or a IGBT) configured to allow/block the flow of a current along said the circuit branch portion 111 while the circuit branch portion 112 comprises a second power switch M2 configured to allow/block the flow of a current along the circuit branch portion 112.

The power drive circuit 1 comprises a second circuit branch 12, which is electrically connected between the input terminals T1, T2 and comprises the output terminal T4.

The circuit branch 12 comprises a third circuit branch portion 121 and a fourth circuit branch portion 122.

The circuit branch portion 121 is arranged between the output terminal T4 and the input terminal T2 whereas the circuit branch portion 122 is arranged between the input terminal T1 and the output terminal T4.

The circuit branch portion 121 comprises a third power switch M3 (e.g. a MOSFET or a IGBT) configured to allow/block the flow of a current along the circuit branch portion 121 while the circuit branch portion 122 comprises a fourth power switch M4 configured to allow/block the flow of a current along the circuit branch portion 122.

From a circuital point of view, the power switches M1, M2, M3, M4 may be arranged in a known manner.

As an example, each of them may be advantageously provided with a free-wheeling diode and with a suitable polarization network.

The control means 50 are electrically connected to the power switches M1, M2, M3, M4 and are configured to provide control signals C1, C2, C3, C4 to the latters (at the gate or base terminals thereof), so that each power switch is switchable between an ON state, at which it allows the flow of a current along the corresponding branch portion, and an OFF state, at which it blocks the flow of a current along said corresponding branch portion.

According to the invention, the power drive circuit 1 comprises first sensing means S1 configured to provide first sensing signals D1 indicative of a current flowing along the first circuit branch 11 and second sensing means S2 configured to provide second sensing signals D2 indicative of a current flowing along the second circuit branch 12.

Preferably, the sensing means S1, S2 are operatively positioned at the lower circuit branch portions 112, 121 of the power switch drive 1.

The sensing means S1, S2 are thus preferably configured to provide corresponding sensing signals D1, D2 indicative of the currents I1, I2 flowing along the second and third circuit branch portions 112, 121, respectively.

According to alternative embodiments of the invention, however, the sensing means S1, S2 may be operatively positioned at the higher circuit branch portions 111, 122 of the power switch drive 1.

The sensing means S1, S2 may be positioned downstream or upstream with respect to the power switch of the circuit branch portion, in which they are operatively placed.

The sensing means S1, S2 may comprise a corresponding current sensor of known type.

As an example, the sensing means S1, S2 may include corresponding shunt resistors electrically connected in series to the power switches M2, M3 respectively, at the circuit branch portions 112, 121.

Preferably, the power drive circuit 1 comprises third sensing means S3 configured to provide third sensing signals S3 indicative of a current I3 flowing along the excitation winding 152 of the electromagnetic actuator 15.

In practice, the sensing means S3 are configured to sense the current I3 provided to the electromagnetic actuator 15 by the power drive circuit 1.

The sensing means S3 may be positioned downstream or upstream with respect to excitation winding 152.

The sensing means S3 may comprise a corresponding current sensor of known type.

As an example, the sensing means S3 may include a Hall-Effect sensor operatively coupled at one of the output terminals T3, T4 of the power drive circuit 1.

Preferably, the power drive circuit 1 comprises fourth sensing means S4 configured to provide fourth sensing signals D4 indicative of the voltage V3 at the output terminal T3 and fifth sensing means S5 configured to provide fifth sensing signals D5 indicative of the voltage V4 at the output terminal T4.

The sensing means S4, S5 may comprise a corresponding voltage sensor of known type.

As an example, the sensing means S4, S5 may include corresponding resistive voltage dividers electrically connected between the output terminals T3, T4 and ground terminals of the power drive switch 1.

Preferably, the power drive circuit 1 comprises sixth sensing means S6 configured to provide sixth sensing signals D6 indicative of the voltage VC between the input terminals T1, T2 (i.e. of the voltage across the storage capacitor C).

The sensing means S6 may comprise a corresponding voltage sensor of known type.

As an example, the sensing means S6 may include a voltage shunt electrically connected between the terminals T1, T2.

Preferably, the circuit branches 11, 12 of the power drive circuit 1 are provided with corresponding auxiliary circuits A1, A2, each of which is electrically connected between the input terminals T1, T2.

The auxiliary circuits A1, A2 are shown in FIG. 2A, in which the sensing means S1, S2, S3, S4, S5, S6 are not shown (for the sake of clarity only).

Preferably, each auxiliary circuit A1, A2 comprises a resistive voltage divider electric connected between the input terminals T1, T2 and having a corresponding terminal T3, T4 as output terminal.

The auxiliary circuits A1, A2 are configured to polarize the output terminals T3, T4 to given polarization voltages, when the power switches M1, M2, M3, M4 are in OFF state.

Ideally, said polarization voltages are predefined (e.g. 0.5 of the voltage VC between the input terminals T1, T2) and depend on the values of the resistors used in the voltage dividers A1, A2.

As the power switches M1, M2, M3, M4 do not operate as ideal switches (e.g. parasitic or leakage currents are typically present), said polarization voltages may vary within a predefined range.

Preferably, the auxiliary circuits A1, A2 are configured so that the polarization voltages at the output terminals T3, T4 are comprised between the 10% and the 90% of the voltage VC between the input terminals T1, T2, when the power switches M1, M2, M3, M4 are in OFF state.

This solution allows avoiding excessive voltage fluctuations at the output terminals T3, T4.

The control means 50 are electrically connected to the sensing means S1, S2, S3, S4, S5, S6 and are configured to receive and process the sensing signals D1, D2, D3, D4, D5, D6 provided by these latters.

The power circuit 1 allows implementing fault protection functions during the operation of the switching device 1.

According to the embodiment of the invention shown in FIGS. 1 and 2-2A, the power drive circuit 1 may be advantageously employed to implement a fault protection method 20 during the operation of the switching device 100.

The fault protection method 20 advantageously comprises the following steps (FIG. 4):
  acquiring the first and second sensing signals D1, D2 from the sensing means S1, S2;
  determining the presence of possible faults at the power drive circuit 1 on the base of the sensing signals D1, D2;
  providing control signals C1, C2, C3, C4 to switch all the power switches M1, M2, M3, M4 in an OFF state if the presence of possible faults is determined.

The sensing signals D1, D2 provide information on the currents I1, I2 circulating along the circuit branch portions 112, 121.

The identification of possible fault conditions may be obtained by comparing the currents I1, I2 detected by the sensing means S1, S2 with given threshold values TH1.

If the currents I1, I2 exceed the threshold value TH1, faults (e.g. short circuits) at the power drive circuit 1 may be present.

Threshold values TH1 may be advantageously set to ensure that the power switches M1, M2, M3, M4 are always maintained within their SOA (Safe Operating Area) and are not subject to braking-off phenomena or accelerated ageing phenomena.

If no faults are detected, the method 20 is cyclically repeated.

The fault protection method 20 may be hardware implemented by the control means 50.

In this case, the control means 50 are preferably provided with a suitable comparator circuit configured to execute the method 20.

As an alternative, the control means 50 may be configured to execute software instructions to implement the fault protection method 20.

It is underlined that the fault protection method is cyclically executed during the operation of the switching device 100, i.e. during the period of time in which the power drive circuit 1 provides suitable excitation currents to the electromagnetic actuator 15.

The control means 50 are advantageously configured to execute the fault protection method 20 in a time interval that is very shorter than the operation time of the electromagnetic actuator 15.

Such a time interval depends on the physical characteristics of the power switches M1, M2, M3, M4. As an example, in case of fault conditions, power switches M1, M2, M3, M4 may be switched-off within an overall time interval of 1 μs.

The power circuit 1 allows implementing over-current protection functions during the operation of the switching device 1.

According to the embodiment of the invention shown in FIGS. 1 and 2-2A, the power drive circuit 1 may be advantageously employed to implement an over-current protection method 30 during the operation of the switching device 100.

The over-current protection method 30 advantageously comprises the following steps (FIG. 5):
  acquiring the third sensing signals D3 from the sensing means S3;
  determining the presence of possible over-currents at the power drive switch 1 and/or at the excitation winding 152 on the base of the sensing signals D3;
  providing control signals C1, C2, C3, C4 to switch all the power switches M1, M2, M3, M4 in an OFF state if the presence of possible over-currents is determined.

The sensing signals D3 provide information on the currents I3 circulating along the excitation winding 152.

The identification of possible fault conditions may be obtained by comparing the current I3 detected by the sensing means S3 with a given threshold value TH2.

If the current I3 exceeds the threshold value TH2, over-currents at the power drive switch 1 and/or at the excitation winding 152 may be present.

Similarly to the above, threshold values TH2 may be advantageously set to ensure that the power switches M1, M2, M3, M4 are always maintained within their SOA (Safe Operating Area) and are not subject to braking-off phenomena or accelerated ageing phenomena.

If no over-currents are detected, the over-current protection method 30 is cyclically repeated.

The control means 50 are advantageously configured to execute software instructions to implement the over-current protection method 30.

The fault protection method 30 is executed during the operation of the switching device 100. The control means 50 are advantageously configured to execute the over-current protection method 30 in a time interval that is very shorter than the operation time of the electromagnetic actuator 15.

The power circuit 1 allows implementing fault diagnostic functions when the switching device 1 is not operating (i.e. it is in a closing or opening status).

According to the embodiment of the invention shown in FIGS. 1 and 2-2A, the power drive circuit 1 may be advantageously employed to implement a fault determination method 40 during the operation of the switching device 100.

In a general definition, the fault determination method 40 preferably comprises the following steps:
I). providing control signals C1, C2, C3, C4 to switch all the power switches M1, M2, M3, M4 in an OFF state;
II). executing a first fault determination procedure 500;
III). providing control signals to switch one selected switch in an ON state and to maintain all the remaining power switches in an OFF state;
IV). executing said first fault determination procedure;

V). providing control signals to switch the selected switch in an OFF state;

VI). if no faults are identified, repeating the previous steps iii)-v) for another selected switch of said power switches, which has not already been selected during the execution of said fault determination method; or VII). terminating the fault determination method, when all the power switches have been selected once.

As is apparent from the above, the fault determination method 40 basically consists in repeating the fault determination procedure 500 when the power switches M1, M2, M3, M4 are all in an OFF state and when said power switches are cyclically selected and switched (one at time) in an ON state.

The power switches M1, M2, M3, M4 are cyclically selected and switched (one at time) in an ON state according to a switching sequence that may change depending on the type of the power switches.

Preferably, said switching sequence is configured so that the power switches M1, M2 or M3, M4 of a same circuit branch 11 or 12 are selected and switched (one at time) in an ON state in a consecutive manner.

Preferably, said switching sequence is configured so that the power switch M2, M3 positioned in the lower branch portion 112, 121 of a given circuit branch 11, 12 is selected and switched (one at time) in an ON state before the power switch M1, M4 positioned in the upper branch portion 111, 122 of the same corresponding circuit branch 11, 12.

Referring to FIGS. 6-7, an example of the fault determination method is described in details.

According to this example, the fault determination method 40 advantageously comprises the following steps:

providing control signals C1, C2, C3, C4 to switch the power switches M1, M2, M3, M4 in an OFF state;

executing a first fault determination procedure 500;

if no faults are identified, providing control signals to switch the power switch M2 in an ON state and maintain the power switches M1, M3, M4 in an OFF state;

executing the fault determination procedure 500;

if no faults are identified, providing control signals to switch the power switch M2 in an OFF state;

providing control signals to switch the power switch M1 in an ON state and maintain the power switches M2, M3, M4 in an OFF state;

executing the fault determination procedure 500;

if no faults are identified, providing control signals to switch the power switch M1 in an OFF state;

providing control signals to switch the power switch M3 in an ON state and maintain the power switches M1, M2, M4 in an OFF state;

executing the fault determination procedure 500;

if no faults are identified, providing control signals to switch the power switch M3 in an OFF state;

providing control signals to switch the power switch M4 in an ON state and maintain the power switches M1, M2, M3 in an OFF state;

executing the fault determination procedure 500;

if no faults are identified, providing control signals C4 to switch the power switch M4 in an OFF state.

In the above described example, the power switches M1, M2, M3, M4 are cyclically selected and switched (one at time) in an ON state according to the switching sequence M2-M1-M3-M4, which is particularly advantageous if said power switches are MOSFETs of the enhancement type, since it allows simplifying the polarization network of each power switch.

According to a further possible example (not shown in the figures), the fault determination method 40 advantageously comprises the following steps:

providing control signals C1, C2, C3, C4 to switch the power switches M1, M2, M3, M4 in an OFF state;

executing a first fault determination procedure 500;

if no faults are identified, providing control signals to switch the power switch M3 in an ON state and maintain all the remaining power switches M1, M2, M4 in an OFF state;

executing the fault determination procedure 500;

if no faults are identified, providing control signals to switch the power switch M3 in an OFF state;

providing control signals to switch the power switch M4 in an ON state and maintain all the remaining power switches M1, M2, M3 in an OFF state;

executing the fault determination procedure 500;

if no faults are identified, providing control signals to switch the power switch M4 in an OFF state;

providing control signals to switch the power switch M2 in an ON state and maintain all the remaining power switches M1, M3, M4 in an OFF state;

executing the fault determination procedure 500;

if no faults are identified, providing control signals to switch the power switch M2 in an OFF state;

providing control signals to switch the power switch M1 in an ON state and maintain all the remaining power switches M2, M3, M4 in an OFF state;

executing the fault determination procedure 500;

if no faults are identified, providing control signals to switch the power switch M1 in an OFF state.

In the above described example, the power switches M1, M2, M3, M4 are cyclically selected and switched (one at time) in an ON state according to the switching sequence M3-M4-M2-M1.

Other examples of the fault determination method 40 are possible. To this aim, it is sufficient to vary the sequence chosen for selecting and switching (one at the time) the power switching M1, M2, M3, M4 in an ON state.

Preferably, the fault determination procedure 500 comprises the following steps (FIG. 8):

acquiring the sensing signals D1, D2, D3 from the sensing means S1, S2, S3 respectively;

identifying possible faults at the power switches M1, M2, M3, M4 on the base of the sensing signals D1, D2, D3.

The acquisition of the sensing signals D1, D2, D3 allows checking whether currents I1, I2, I3 are circulating along the circuit branch 11, along the circuit branch 12 and along the excitation winding 152 in order to identify possible fault conditions.

The identification criteria of possible fault conditions may vary depending on the operative conditions (ON, OFF) of the power switches M1, M2, M3, M4, which in turn basically depend on the step of the fault determination method 40 at which the fault determination procedure 500 is executed.

As an example (referred to the embodiment of the fault determination 40 that is shown in the FIGS. 6-7), the criteria described in the table below may be adopted to identify possible fault conditions on the base of the information provided by the sensing signals D1, D2, D3 (when the power switches M1, M2, M3, M4 are MOSFETs).

| Operative condition | Information provided by the sensing signals D1, D2, D3 | Fault identification criteria |
|---|---|---|
| All the power switches in OFF state | I1, I2, I3 ≠ 0 | At least two power switches in fault conditions |
| All the power switches in OFF state | I1, I2, I3 = 0 | No faults |
| Only one power switch in ON state The remaining power switches in OFF state | I1, I2, I3 ≠ 0 | At least one power switch in fault conditions |
| Only one power switch in ON state The remaining power switches in OFF state | I1, I2, I3 = 0 | No faults |

If faults are identified, the fault determination method 40 is terminated and the presence of fault conditions may be properly signalled.

If no faults are identified, the fault determination procedure 500 comprises the steps of:
acquiring the sensing signals D4, D5, D6;
identifying possible faults at the power switches M1, M2, M3, M4 and/or at the excitation winding 152 on the base the sensing signals D4, D5, D6.

If faults are identified, the fault determination method 40 is terminated and the presence of fault conditions may be properly signalled.

The acquisition of the sensing signals D4, D5, D6 allows comparing the voltages V3, V4 at the output terminals T3, T4 with the input voltage VC between the input terminals T1, T2 in order to identify possible fault conditions.

Again, the criteria for the identification of possible fault conditions may vary depending on the operative conditions (ON, OFF) of the power switches M1, M2, M3, M4, which in turn basically depend on the step of the fault determination method 40 at which the fault determination procedure 500 is executed.

As an example (referred to the embodiment of the fault determination 40 that is shown in the FIGS. 6-7), the criteria described in the table below may be adopted to identify possible fault conditions on the base of the information provided by the sensing signals D4, D5, D6, when the power switches M1, M2, M3, M4 are MOSFETs.

| Operative condition | Information provided by the sensing signals D4, D5, D6 | Fault identification criteria |
|---|---|---|
| All the power switches in OFF state | 0.1 VC < V3 < 0.9 VC and 0.1 VC < V4 < 0.9 VC | No faults |
| All the power switches in OFF state | V3 or V4 > 0.9 VC | At least one of power switches M1, M4 in fault conditions |
| All the power switches in OFF state | V3 or V4 < 0.1 VC | At least one of power switches M2, M3 in fault conditions |
| All the power switches in OFF state | 0.1 VC < V3 < 0.9 VC and V4 < 0.1 VC | Power switch M3 and excitation winding in in fault conditions |
| All the power switches in OFF state | 0.1 VC < V3 < 0.9 VC and V3 > 0.9 VC | Power switch M4 and excitation winding in in fault conditions |
| All the power switches in OFF state | 0.1 VC < V4 < 0.9 VC and V4 < 0.1 VC | Power switch M2 and excitation winding in in fault conditions |
| All the power switches in OFF state | 0.1 VC < V3 < 0.9 VC and V3 > 0.9 VC | Power switch M1 and excitation winding in in fault conditions |
| Power switch M2 in ON state The remaining power switches in OFF state | 0.1 VC < V3 < 0.9 VC and 0.1 VC < V4 < 0.9 VC | Power switch M2 in fault conditions |
| Power switch M2 in ON state The remaining power switches in OFF state | V3 and V4 < 0.1 VC | No faults |
| Power switch M2 in ON state The remaining power switches in OFF state | V3 < 0.1 VC and V4 > 0.1 VC | Excitation winding in fault conditions |
| Power switch M1 in ON state The remaining power switches in OFF state | 0.1 VC < V3 < 0.9 VC and 0.1 VC < V4 < 0.9 VC | Power switch M1 in fault conditions |
| Power switch M1 in ON state The remaining power switches in OFF state | V3 or V4 > 0.9 VC | No faults |
| Power switch M1 in ON state The remaining power switches in OFF state | V3 > 0.9 VC and V4 < 0.9 VC | Excitation winding in fault conditions |
| Power switch M3 in ON state The remaining power switches in OFF state | 0.1 VC < V3 < 0.9 VC and 0.1 VC < V4 < 0.9 VC | Power switch M3 in fault conditions |
| Power switch M3 in ON state The remaining power switches in OFF state | V3 and V4 < 0.1 VC | No faults |
| Power switch M3 in ON state The remaining power switches in OFF state | V4 < 0.1 VC and V3 > 0.1 VC | Excitation winding in fault conditions |

-continued

| Operative condition | Information provided by the sensing signals D4, D5, D6 | Fault identification criteria |
|---|---|---|
| Power switch M4 in ON state The remaining power switches in OFF state | 0.1 VC < V3 < 0.9 VC and 0.1 VC < V4 < 0.9 VC | Power switch M4 in fault conditions |
| Power switch M4 in ON state The remaining power switches in OFF state | V3 and V4 > 0.9 VC | No faults |
| Power switch M4 in ON state The remaining power switches in OFF state | V4 > 0.9 VC and V3 < 0.9 VC | Excitation winding in fault conditions |

Obviously, the above described criteria to identify possible fault conditions may vary depending on the switching sequence of the power switches M1, M2, M3, M4 and on the type of these latters.

When a fault is identified, the fault determination method 40 is terminated and the presence of fault conditions may be properly signalled.

Preferably, the fault determination method 40 is repeated cyclically when the switching device 100 is not operating.

Preferably, the fault determination method 40 is executed at the end of each operation of the switching device 100.

Preferably, the fault protection method 20 described above is cyclically executed during the execution of the fault determination method 40, in a concurrent manner.

The control means 50 are advantageously configured to execute software instructions to implement the fault determination method 40 and the related fault determination procedure 500.

FIGS. 3, 3A refer to an embodiment of the invention in which the electromagnetic actuator 15 is an electric motor, e.g. a brushless motor.

As mentioned above, in this case, the electromagnetic actuator 15 comprises multiple (e.g. three for a three-phase motor) excitation windings 152A, 152B, 152C that form the stator windings of the electric motor.

Said excitation windings may be arranged in a known manner, e.g. according to a star configuration (as shown in FIG. 3) or a triangle configuration.

According to this embodiment, the power drive circuit 1 comprises the above described input terminals T1, T2 electrically connected to the power supply means 60.

Also in this embodiment, the power drive circuit 1 preferably comprises at least a storage capacitor C electrically connected in parallel to the input terminals T1, T2 and configured to store electrical energy to operate the electromagnetic actuator.

In the embodiment shown in FIG. 3, the power drive circuit 1 comprises a first output terminal T3, a second output terminal T4 and a third output terminal T5, which are electrically connected to the first excitation winding 152A, second excitation winding 152B and the third excitation winding 152C of the electromagnetic actuator 15, respectively.

If said excitation windings are arranged according to a star configuration, each excitation winding 152A, 152B, 152C is electrically connected in series with a corresponding terminal T3, T4, T5 and the star-center terminal of said excitation windings.

If said excitation windings are arranged according to a triangle configuration, each excitation winding 152A, 152B, 152C is electrically connected between two of the terminals T3, T4, T5. The power drive circuit 1 has basically a multiple-phase (e.g. three-phase) inverter circuit configuration that is similar to the one described above.

The power drive circuit 1 comprises a first circuit branch 11, which is electrically connected between the input terminals T1, T2 and comprises the output terminal T3.

The circuit branch 11 comprises a first circuit branch portion 111 and a second circuit branch portion 112.

The circuit branch portion 111 is arranged between the input terminal T1 and the output terminal T3 whereas the circuit branch portion 112 is arranged between the output terminal T3 and the input terminal T2.

The circuit branch portion 111 comprises a first power switch M1 (e.g. a MOSFET or a IGBT) configured to allow/block the flow of a current along the circuit branch portion 111 whereas the circuit branch portion 112 comprises a second power switch M2 configured to allow/block the flow of a current along the circuit branch portion 112.

The power drive circuit 1 comprises a second circuit branch 12, which is electrically connected between the input terminals T1, T2 and comprises the output terminal T4.

The circuit branch 12 comprises a third circuit branch portion 121 and a fourth circuit branch portion 122.

The circuit branch portion 121 is arranged between the output terminal T4 and the input terminal T2 whereas the circuit branch portion 122 is arranged between the input terminal T1 and the output terminal T4.

The circuit branch portion 121 comprises a third power switch M3 (e.g. a MOSFET or a IGBT) configured to allow/block the flow of a current along the circuit branch portion 121 whereas the circuit branch portion 122 comprises a fourth power switch M4 configured to allow/block the flow of a current along the circuit branch portion 122.

The power drive circuit 1 comprises a third circuit branch 13, which is electrically connected between the input terminals T1, T2 and comprises the output terminal T5.

The circuit branch 13 comprises a fifth circuit branch portion 131 and a sixth circuit branch portion 132.

The fifth circuit branch portion 131 is arranged between the output terminal T5 and the input terminal T2 whereas the circuit branch portion 132 is arranged between the input terminal T1 and the output terminal T5.

The circuit branch portion 131 comprises a fifth power switch M5 (e.g. a MOSFET or a IGBT) configured to allow/block the flow of a current along the circuit branch portion 131 whereas the circuit branch portion 132 comprises a sixth power switch M6 configured to allow/block the flow of a current along the circuit branch portion 132.

Also in this embodiment, the power switches M1, M2, M3, M4, M5 and M6 may be arranged in a known manner from a circuital point of view.

As an example, each of them may be advantageously provided with a free-wheeling diode and with a suitable polarization network.

The control means 50 are electrically connected to the power switches M1, M2, M3, M4, M5, M6 and are configured to provide a control signal C1, C2, C3, C4, C5, C6 to the latters (at the gate or base terminals thereof), so that each power switch is switchable between an ON state, at which it allows the flow of a current along the corresponding branch portion, and an OFF state, at which it blocks the flow of a current along said corresponding branch portion.

According to the invention, the power drive circuit 1 comprises first sensing means S1, second sensing means S2 and seventh sensing means S7 that are respectively configured to provide first, second and seventh sensing signals D1, D2, D7.

The sensing signals D1, D2, D7 are respectively indicative of a current flowing along the first circuit branch 11, the second circuit branch 12 and the third circuit branch 13.

Preferably, the sensing means S1, S2, S7 are operatively positioned at the lower circuit branch portions 112, 121, 131 of the power switch drive 1.

The sensing means S1, S2, S7 are thus preferably configured to provide corresponding sensing signals D1, D2, D7 indicative of the currents I1, I2, I7 flowing along the circuit branch portions 112, 121, 131, respectively.

According to alternative embodiments of the invention, however, the sensing means S1, S2, S7 may be operatively positioned at the higher circuit branch portions 111, 122, 132 of the power switch drive 1.

The sensing means S1, S2, S7 may be positioned downstream or upstream with respect to the power switch of the circuit branch portion, in which they are operatively placed.

The sensing means S1, S2, S7 may comprise corresponding current sensors of known type, as described above.

Preferably, the power drive circuit 1 comprises third sensing means S3 and eighth sensing means S8 that are respectively configured to provide third sensing signals D3 and eighth sensing signals D8.

The sensing signals D3, D8 are respectively indicative of the current flowing along the first and second excitation windings 152A, 152B, respectively.

In other words, the sensing means S3, S8 are configured to sense the currents I3, I8 provided to at least two excitation windings of the electromagnetic actuator 15 by the power drive circuit 1.

The current I9 provided by the power drive circuit 1 to the third excitation winding 152C may be easily calculated by the control means 50 on the base of the sensing signals D3, D8.

However, the power drive circuit 1 preferably comprises ninth sensing means S9 configured to provide ninth sensing signals D9 indicative of the current I9 flowing along the third excitation winding 152C.

The sensing means S3, S8, S9 may comprise corresponding current sensors of known type, as described above.

Preferably, the power drive circuit 1 comprises fourth sensing means S4, fifth sensing means S5, sixth sensing means S6 and tenth sensing means S10 that are configured to provide fourth sensing signals S4, fifth sensing signals S5, sixth sensing signals S6 and tenth sensing signals S10, respectively.

The sensing signals S4, S5, S10 are respectively indicative of the voltages V3, V4 and V5 at the output terminals T3, T4 and T5.

The sensing signals S6 are indicative of the voltage VC between the input terminals T1, T2 (i.e. the voltage at which the storage capacitor C is charged).

The sensing means S4, S5, S6, S10 may comprise a corresponding voltage sensor that may be of known type, as described above.

Preferably, the circuit branches 11, 12, 13 of the power drive circuit 1 are provided with corresponding auxiliary circuits A1, A2, A3, each of which is electrically connected between the input terminals T1, T2.

The auxiliary circuits A1, A2, A3 are shown in FIG. 3A, in which the sensing means S1, S2, S3, S4, S5, S6, S7, S8, S9, S10 are not shown (for the sake of clarity only).

Preferably, each auxiliary circuit A1, A2, A3 comprises a resistive voltage divider electric connected between the input terminals T1, T2 and having a corresponding terminal T3, T4, T5 as output terminal.

The auxiliary circuits A1, A2, A3 are configured to polarize the output terminals T3, T4, T5 to given polarization voltages, when the power switches M1, M2, M3, M4, M5, M6 are in OFF state.

Ideally, said polarization voltages are predefined (e.g. 0.5 of the voltage VC between the input terminals T1, T2) and depend on the values of the resistors used in the voltage dividers A1, A2, A3.

As the power switches M1, M2, M3, M4, M5, M6 do not operate as ideal switches (e.g. parasitic or leakage currents are typically present), said polarization voltages may vary within a predefined range.

Preferably, the auxiliary circuits A1, A2, A3 are configured so that the polarization voltages at the output terminals T3, T4, T5 are comprised between the 10% and the 90% of the voltage VC between the input terminals T1, T2, when the power switches M1, M2, M3, M4, M5, M6 are in OFF state.

The control means 50 are electrically connected to the sensing means S1, S2, S3, S4, S5, S6 and are configured to receive and process the sensing signals D1, D2, D3, D4, D5, D6 provided by these latters.

The control means 50 are electrically connected to the sensing means S1, S2, S3, S4, S5, S6, S7, S8, S9, S10 and are configured to receive and process the sensing signals D1, D2, D3, D4, D5, D6, D7, D8, D9, D10 provided by these latters.

The power circuit 1 allows implementing fault protection functions during the operation of the switching device 1.

According to the embodiment of the invention shown in FIGS. 1 and 3-3A, the power drive circuit 1 may be advantageously employed to implement a fault protection method 70 during the operation of the switching device 100.

The fault protection method 70 advantageously comprises the following steps (FIG. 9):
  acquiring the first and second sensing signals D1, D2, D7 from the sensing means S1, S2, s10;
  determining the presence of possible faults at the power drive circuit 1 on the base of the sensing signals D1, D2, D7;
  providing control signals C1, C2, C3, C4, C5, C6 to switch the power switches M1, M2, M3, M4, M5, M6 in an OFF state if the presence of possible faults is determined.

The criteria for determining possible faults may be similar, mutatis mutandis, to those that can be adopted for the fault protection method 20 described above.

To this aim, it is sufficient to consider that the power drive circuit 1 has now a circuit structure configured to feed a multi-phase inductive load.

If no faults are detected, the method 70 is cyclically repeated.

The control means 50 are advantageously configured to execute the fault protection method 20 in a time interval that is very shorter than the operation time of the electromagnetic actuator 15.

The fault protection method 70 may be hardware implemented by the control means 50.

In this case, the control means 50 may be provided with a suitable comparator circuit configured to execute the method 20.

As an alternative, the control means 50 may be configured to execute software instructions to implement the fault protection method 70.

The power circuit 1 allows implementing over-current protection functions during the operation of the switching device 1.

According to the embodiment of the invention shown in FIGS. 1 and 3-3A, the power drive circuit 1 may be advantageously employed to implement an over-current protection method 80 during the operation of the switching device 100.

The over-current protection method 80 advantageously comprises the following steps (FIG. 10):
- acquiring the sensing signals D3, D8 and possibly D9 from the sensing means S3, S8 and possibly S9;
- determining the presence of possible over-currents at the power drive switch 1 and/or at the excitation windings 152A, 152B, 152C on the base of the sensing signals D3, D8 and possibly D9;
- providing control signals C1, C2, C3, C4, C5, C6 to switch the power switches M1, M2, M3, M4, M5, M6 in an OFF state if the presence of possible over-currents is determined.

The criteria for determining possible over-currents may be similar, mutatis mutandis, to those that can be adopted for the over-current protection method 30 described above.

To this aim, it is sufficient to consider that the power drive circuit 1 has now a circuit structure configured to feed a multi-phase inductive load.

If no over-currents are detected, the method 80 is cyclically repeated.

The control means 50 are advantageously configured to execute software instructions to implement the over-current protection method 80.

The fault protection method 80 is executed during the operation of the switching devices 100. The control means 50 are advantageously configured to execute the over-current protection method 80 in a time interval that is very shorter than the operation time of the electromagnetic actuator 15.

The power circuit 1 allows implementing fault diagnostic functions when the switching device 1 is not operating.

According to the embodiment of the invention shown in FIGS. 1 and 3-3A, the power drive circuit 1 may be advantageously employed to implement a fault determination method 90 during the operation of the switching device 100.

In a general definition, the fault determination method 90 preferably comprises the following steps:
I). providing control signals C1, C2, C3, C4, C5, C6 to switch all the power switches M1, M2, M3, M4, M5, M6 in an OFF state;
II). executing a second fault determination procedure 800;
III). providing control signals to switch one selected switch in an ON state and to maintain all the remaining power switches in an OFF state;
IV). executing said second fault determination procedure;
V). providing control signals to switch the selected switch in an OFF state;
VI). if no faults are identified, repeating the previous steps III)-V) for another selected switch of said power switches, which has not already been selected during the execution of said fault determination method; or
VII). terminating the fault determination method, when all the power switches have been selected once.

As is apparent from the above, the fault determination method 90 basically consists in repeating the fault determination procedure 800 when the power switches M1, M2, M3, M4, M5, M6 are all in an OFF state and when said power switches are cyclically selected and switched (one at time) in an ON state.

The power switches M1, M2, M3, M4, M5, M6 are cyclically selected and switched (one at time) in an ON state according to a switching sequence that may change depending on the type of the power switches.

Preferably, said switching sequence is configured so that the power switches M1, M2 or M3, M4 or M5, M6 of a same circuit branch 11 or 12 or 13 are selected and switched (one at time) in an ON state in a consecutive manner.

Preferably, said switching sequence is configured so that the power switch M2, M3, M5 positioned in the lower branch portion 112, 121, 131 of a given circuit branch 11, 12, 13 is selected and switched (one at time) in an ON state before the power switch M1, M4, M6 positioned in the upper branch portion 111, 122, 132 of the same corresponding circuit branch 11, 12, 13.

Figure 11:
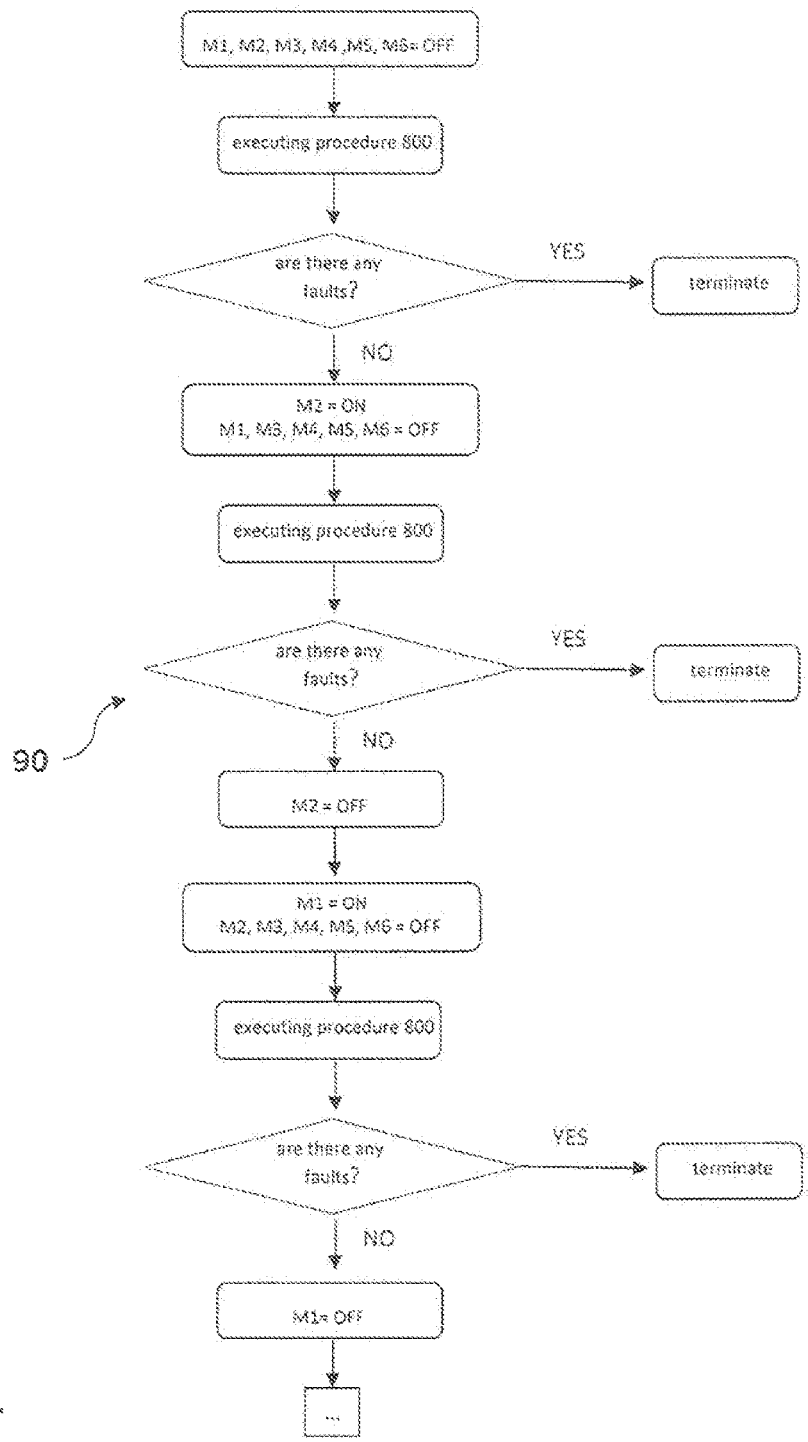
Figure 12:
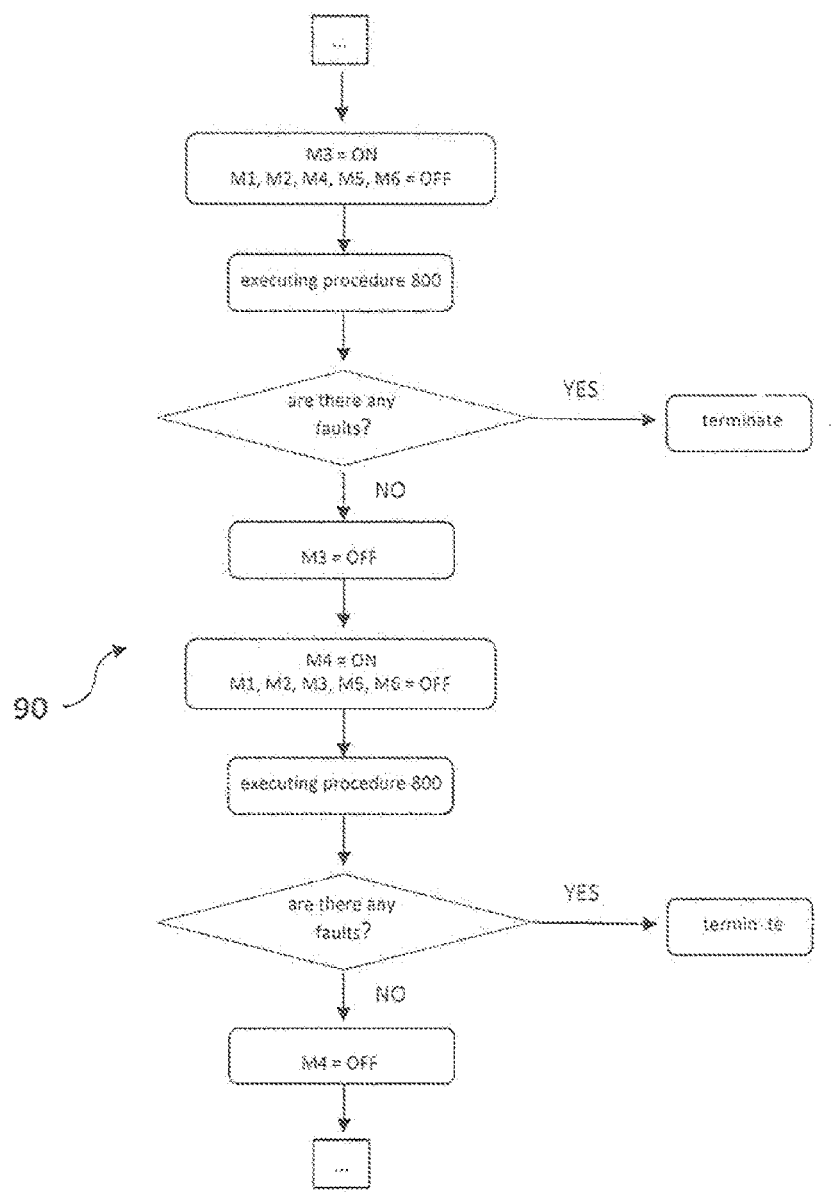
Figure 13:
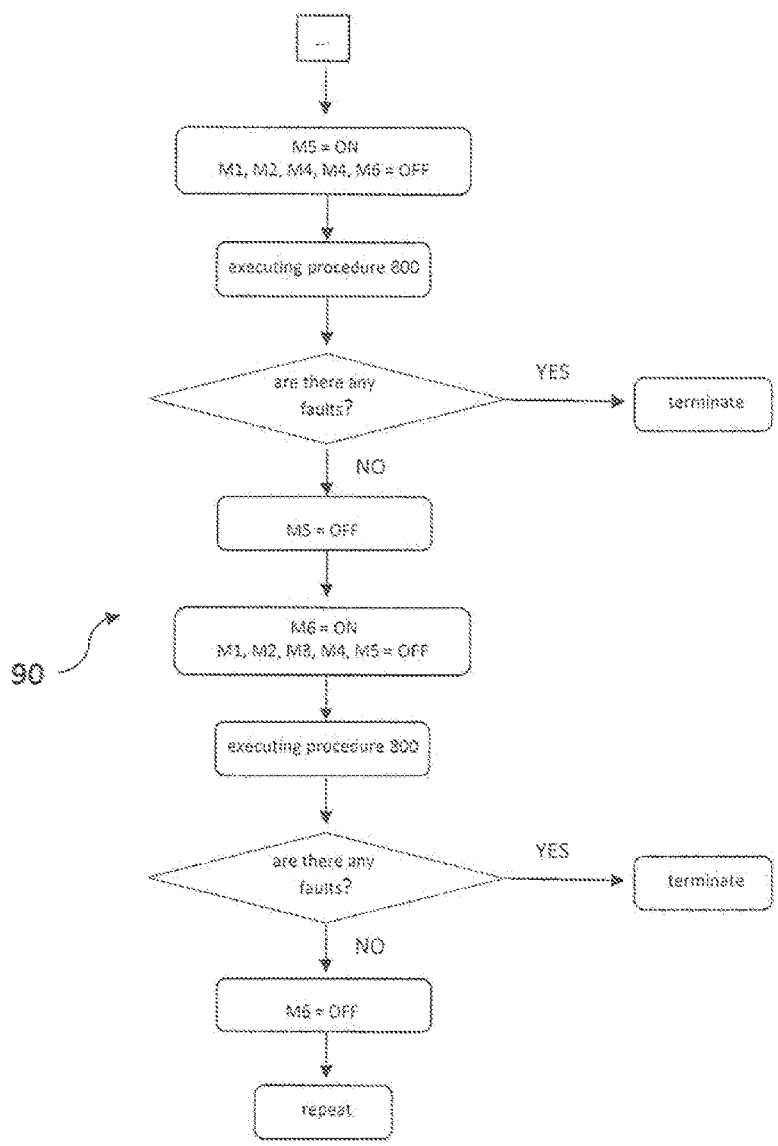
Figure 14:
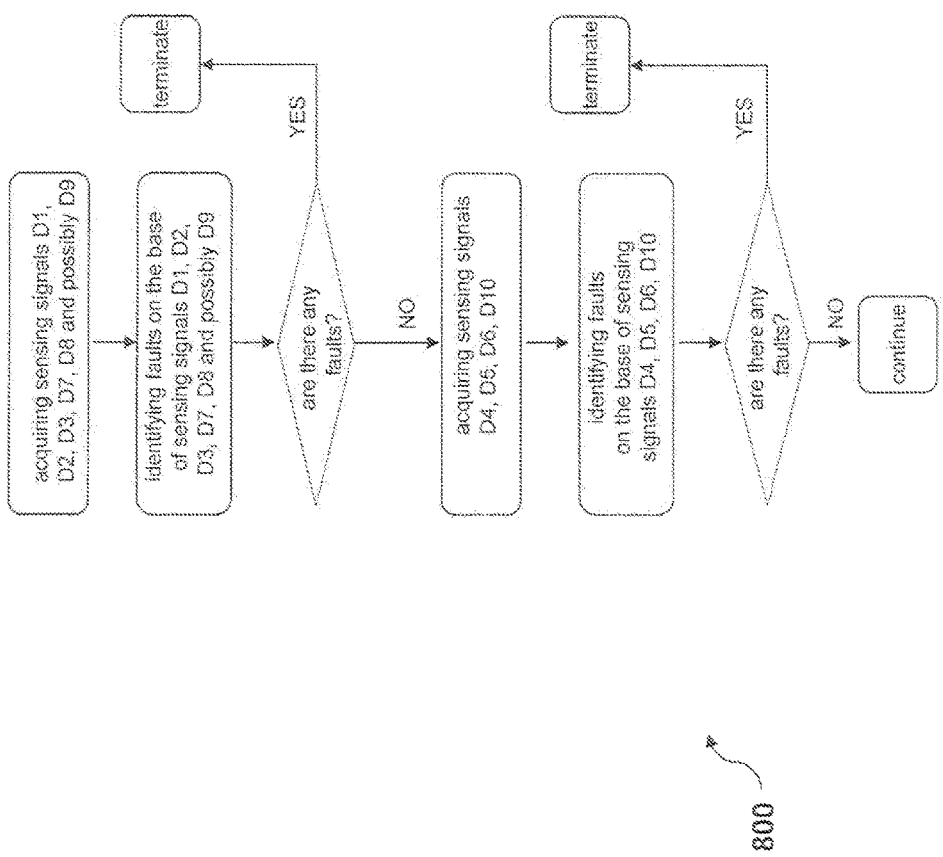

An example of the fault determination method 90 is described with reference to the following FIGS. 11-13.

According to such an example, the fault determination method 90 advantageously comprises the following steps:
- providing control signals C1, C2, C3, C4, C5, C6 to switch the power switches M1, M2, M3, M4, M5, M6 in an OFF state;
- executing a second fault determination procedure 800;
- if no faults are identified, providing control signals to switch the power switch M2 in an ON state and maintain all the remaining power switches in an OFF state;
- executing the fault determination procedure 800;
- if no faults are identified, providing control signals to switch the power switch M2 in an OFF state;
- providing control signals to switch the power switch M1 in an ON state and maintain all the remaining power switches M2, M3, M4, M5, M6 in an OFF state;
- executing the fault determination procedure 800;
- if no faults are identified, providing control signals to switch the power switch M1 in an OFF state;
- providing control signals to switch the power switch M3 in an ON state and maintain all the remaining power switches M1, M2, M4, M5, M6 in an OFF state;
- executing the fault determination procedure 800;
- if no faults are identified, providing control signals to switch the power switch M3 in an OFF state;
- providing control signals to switch the power switch M4 in an ON state and maintain all the remaining power switches M1, M2, M3, M5, M6 in an OFF state;
- executing the fault determination procedure 800;
- if no faults are identified, providing control signals to switch the power switch M4 in an OFF state;
- providing control signals to switch the power switch M5 in an ON state and maintain all the remaining power switches M1, M2, M3, M4, M6 in an OFF state;
- executing the fault determination procedure 800;

if no faults are identified, providing control signals to switch the power switch M5 in an OFF state;

providing control signals to switch the power switch M6 in an ON state and maintain all the remaining power switches M1, M2, M3, M4, M5 in an OFF state;

executing the fault determination procedure 800;

if no faults are identified, providing control signals to switch the power switch M6 in an OFF state.

In the above described example, the power switches M1, M2, M3, M4, M5, M6 are cyclically selected and switched (one at time) in an ON state according to the switching sequence M2-M1-M3-M4-M5-M6.

Other examples of the fault determination method 90 are possible. To this aim, it is sufficient to vary the sequence chosen for selecting and switching (one at the time) the power switching M1, M2, M3, M4, M5, M6 in an ON state.

Preferably, the fault determination procedure 800 comprises the following steps (FIG. 14):

acquiring the sensing signals D1, D2, D3, D7, D8, D9 from the sensing means S1, S2, S3, S7, S8 and possibly S9, respectively;

identifying possible faults at the power switches M1, M2, M3, M4, M5, M6 on the base of the sensing signals D1, D2, D3, D7, D8, D9.

The acquisition of the sensing signals D1, D2, D3, D7, D8, D9 allows checking whether currents I1, I2, I3, I7, I8, I9 are circulating along the circuit branches 11, 12, 13 and along the excitation windings 152A, 152B, 152C in order to identify possible fault conditions.

The criteria to be adopted for the identification of possible fault conditions on the base of the sensing signals D1, D2, D3, D7, D8, D9 may be similar, mutatis mutandis, to those that can be adopted for the fault determination procedure 800 described above.

To this aim, it is sufficient to consider that the power drive circuit 1 has now a circuit structure configured to feed a multi-phase inductive load.

If faults are identified, the fault determination method 90 is terminated and the presence of fault conditions may be properly signalled.

If no faults are identified, the fault determination procedure 800 comprises the steps of:

acquiring the sensing signals D4, D5, D6, D10 from the sensing means S4, S5, S6, S10;

identifying possible faults at the power switches M1, M2, M3, M4, M5, M6 or at the excitation windings 152A, 152B, 152C on the base the sensing signals D4, D5, D6, D10.

The acquisition of the sensing signals D4, D5, D6, D10 allows comparing the voltages V3, V4, V5 at the output terminals T3, T4, T5 with the input voltage VC between the input terminals T1, T2 in order to identify possible fault conditions.

The criteria to be adopted for the identification of possible fault conditions on the base of the sensing signals D4, D5, D6, D10 may be similar, mutatis mutandis, to those that can be adopted for the fault determination procedure 800 described above.

To this aim, it is sufficient to consider that the power drive circuit 1 has now a circuit structure configured to feed a multi-phase inductive load.

Obviously, said fault identification criteria may vary depending on the switching sequence of the power switches M1, M2, M3, M4, M5, M6 and on the type of these latters.

If faults are identified, the fault determination method 40 is terminated and the presence of fault conditions may be properly signalled.

Preferably, the fault determination method 90 is cyclically repeated when the switching device 100 is not operating.

Preferably, the fault determination method 90 is executed at the end of each operation of the switching device 100.

Preferably, the fault protection method 70 described above is cyclically executed during the execution of the fault determination method 40, in a concurrent manner.

The control means 50 are advantageously configured to execute software instructions to implement the fault determination method 90 and the related fault determination procedure 800.

The MV switching device 100, according to the repent invention, offers relevant advantages with respect to the available solutions of the state of the art.

The MV switching device 100 is provided with means (the power drive circuit 1 and the control means 50) for ensuring an effective protection against breakdown phenomena of the power switches of the power drive circuit 1 during the switching operation.

This allows avoiding the occurrence of permanent damages to the power drive circuit, to the electromagnetic actuator and to the electrical connections between the power drive circuit and the electromagnetic actuator.

Further, this allows avoiding unexpected out of service events of the switching device and ensures a proper execution of switching operations.

The MV switching device 100 is provided with means (the power drive circuit 1 and the control means 50) for carrying out fault diagnostic functions that on a periodic time-base. Said fault diagnostic functions allow checking the actual functionality of the power drive circuit, the electromagnetic actuator and of the electrical connections between the power drive circuit and the electromagnetic actuator.

This allows effectively preventing the occurrence of relevant fault events and remarkably facilitates the planning and execution of maintenance interventions.

The MV switching device 100 is relatively easy and cheap to manufacture at industrial level.

The invention claimed is:

1. A MV switching device comprising:

an electromagnetic actuator for actuating electric contacts of said switching device, said electromagnetic actuator having at least an excitation winding;

power supply means for supplying electric power to said electromagnetic actuator;

a power drive circuit for driving said electromagnetic actuator, said power drive circuit comprising:

a first input terminal and a second input terminal electrically connected to said power supply means and establishing a voltage Vc between the first and second input terminals;

at least a first output terminal and a second output terminal electrically connected to said excitation winding;

a first circuit branch, which is electrically connected between said first and second input terminals and comprises said first output terminal, said first circuit branch comprising a first circuit branch portion between said first input terminal and said first output terminal, which comprises a first power switch configured to allow/block the flow of a current along said first circuit branch portion, and a second circuit branch portion between said first output terminal and said second input terminal, which comprises a second power switch configured to allow/block the flow of a current along said second circuit branch portion;

a first auxiliary circuit in parallel with the first circuit branch and connected to the first output terminal, and including a voltage divider to present a voltage at the first output terminal that is 10-90% of Vc when the first and second power switches are blocking the flow of current;

a second circuit branch, which is electrically connected between said first and second input terminals and comprises said second output terminal, said second circuit branch comprising a third circuit branch portion between said second output terminal and said second input terminal, which comprises a third power switch configured to allow/block the flow of a current along said third circuit branch portion, and a fourth circuit branch portion between said first input terminal and said second output terminal, which comprises a fourth power switch configured to allow/block the flow of a current along said fourth circuit branch portion;

a second auxiliary circuit in parallel with the second circuit branch and connected to the second output terminal, and including a voltage divider to present a voltage at the second output terminal that is 10-90% of Vc when the third and fourth power switches are blocking the flow of current;

characterised in said power drive circuit comprises:

first sensing means configured to provide first sensing signals indicative of a current flowing along said first circuit branch;

second sensing means configured to provide second sensing signals indicative of a current flowing along said second circuit branch.

2. A MV switching device, according to claim 1, wherein:

said first sensing means are configured to provide first sensing signals indicative of a current flowing along said second circuit branch portion;

said second sensing means are configured to provide first sensing signals indicative of a current flowing along said third circuit branch portion.

3. A MV switching device, according to claim 1, wherein said power drive circuit comprises third sensing means configured to provide third sensing signals indicative of the current flowing along said excitation winding.

4. A MV switching device, according to claim 1, wherein said power drive circuit comprises:

fourth sensing means configured to provide fourth sensing signals indicative of a voltage at said first output terminal;

fifth sensing means configured to provide fifth sensing signals indicative of a voltage at said second output terminal;

sixth sensing means configured to provide sixth sensing signals indicative of a voltage between said first and second input terminals.

5. A MV switching device, comprising:

an electromagnetic actuator for actuating electric contacts of said switching device, said electromagnetic actuator having a first excitation winding, a second excitation winding and a third excitation winding of said electromagnetic actuator;

power supply means for supplying electric power to said electromagnetic actuator;

a power drive circuit for driving said electromagnetic actuator, said power drive circuit comprising:

a first input terminal and a second input terminal electrically connected to said power supply means and establishing a voltage Vc between the first and second input terminals;

a first output terminal, a second output terminal and a third output terminal electrically connected respectively to said first excitation winding, said second excitation winding and said third excitation winding of said electromagnetic actuator;

a first circuit branch, which is electrically connected between said first and second input terminals and comprises said first output terminal, said first circuit branch comprising a first circuit branch portion between said first input terminal and said first output terminal, which comprises a first power switch configured to allow/block the flow of a current along said first circuit branch portion, and a second circuit branch portion between said first output terminal and said second input terminal, which comprises a second power switch configured to allow/block the flow of a current along said second circuit branch portion;

a first auxiliary circuit in parallel with the first circuit branch and connected to the first output terminal, and including a voltage divider to present a voltage at the first output terminal that is 10-90% of Vc when the first and second power switches are blocking the flow of current;

a second circuit branch, which is electrically connected between said first and second input terminals and comprises said second output terminal, said second circuit branch comprising a third circuit branch portion between said second output terminal and said second input terminal, which comprises a third power switch configured to allow/block the flow of a current along said third circuit branch portion, and a fourth circuit branch portion between said first input terminal and said second output terminal, which comprises a fourth power switch configured to allow/block the flow of a current along said fourth circuit branch portion;

a second auxiliary circuit in parallel with the second circuit branch and connected to the second output terminal, and including a voltage divider to present a voltage at the second output terminal that is 10-90% of Vc when the third and fourth power switches are blocking the flow of current;

a third circuit branch, which is electrically connected between said first and second input terminals and comprises said third output terminal, said third circuit branch comprising a fifth circuit branch portion between said third output terminal and said second input terminal, which comprises a fifth power switch configured to allow/block the flow of a current along said fifth circuit branch portion, and a sixth circuit branch portion between said first input terminal and said third output terminal, which comprises a sixth power switch configured to allow/block the flow of a current along said fourth circuit branch portion;

a third auxiliary circuit in parallel with the third circuit branch and connected to the third output terminal, and including a voltage divider to present a voltage at the third output terminal that is 10-90% of Vc when the fifth and sixth power switches are blocking the flow of current;

wherein said power drive circuit comprises:
first sensing means configured to provide first sensing signals indicative of a current flowing along said first circuit branch;
second sensing means configured to provide second sensing signals indicative of a current flowing along said second circuit branch;
seventh sensing means configured to provide seventh sensing signals indicative of a current flowing along said third circuit branch.

6. A MV switching device, according to claim 5, wherein:
said first sensing means are configured to provide first sensing signals indicative of a current-flowing along said second circuit branch portion; and
said second sensing means are configured to provide first sensing signals indicative of a current flowing along said third circuit branch portion;
said seventh sensing means are configured to provide seventh sensing signals indicative of a current flowing along said fifth circuit branch portion.

7. A MV switching device, according to claim 5, wherein it comprises:
third sensing means configured to provide third sensing signals indicative of a current flowing along said first excitation winding;
eighth sensing means configured to provide eighth sensing signals indicative of a current flowing along said second excitation winding.

8. A MV switching device, according to claim 7, wherein it comprises ninth sensing means configured to provide ninth sensing signals indicative of a current flowing along said third excitation winding.

9. A MV switching device, according to claim 5, wherein it comprises:
fourth sensing means configured to provide fourth sensing signals indicative of a voltage at said first output terminal;
fifth sensing means configured to provide fifth sensing signals indicative of a voltage at said second output terminal;
sixth sensing means configured to provide sixth sensing signals indicative of the voltage between said first and second input terminals;
tenth sensing means configured to provide tenth sensing signals indicative of a voltage (V5) of said third output terminal.

10. A MV switching device, according to claim 1, further comprising a controller to execute the following steps:
acquiring said first and second sensing signals;
determining the presence of possible faults on the base of said first and second sensing signals;
providing control signals to switch said first, second, third and fourth power switches in an OFF state if the presence of possible faults is determined.

11. A MV switching device, according to claim 1, further comprising a controller to execute the following steps:
acquiring said third sensing signals;
determining the presence of over-currents on the base of said third sensing signals;
providing control signals to switch said first, second, third and fourth power switches in an OFF state if the presence of possible over-currents is determined.

12. A MV switching device, according to claim 1, further comprising a controller to execute following steps:
I). providing control signals to switch all the power switches in an OFF state;
II). executing a first fault determination procedure;
III). providing control signals to switch one selected switch in an ON state and to maintain all the remaining power switches in an OFF state;
IV). executing said first fault determination procedure;
V). providing control signals to switch the selected switch in an OFF state;
VI). if no faults are identified, repeating the previous steps iii)-v) for another selected switch of said power switches, which has not already been selected during the execution of said fault determination method; or
VII). terminating said fault determination method, when all the power switches have been selected once;
said first fault determination procedure comprising the following steps:
acquiring said first, second and third sensing signals;
identifying possible faults at said power switches and/or at said excitation winding on the base of said first, second and third sensing signals;
if no faults are identified, acquiring said fourth, fifth and sixth sensing signals;
identifying possible faults at said power switches and/or at said excitation winding on the base of said fourth and fifth sensing signals.

13. A MV switching device, according to claim 5, further comprising a controller to execute the following steps:
acquiring said first, second and seventh sensing signals during a switching operation of said switching device;
determining the presence of possible faults on the base of said first and second sensing signals;
providing control signals to switch all the power switches in an OFF state if the presence of possible faults is determined.

14. A MV switching device, according to claim 5, further comprising a controller to execute the following steps:
acquiring said third, eighth and possibly ninth sensing signals;
determining the presence of possible over-currents on the base of third, eighth and possibly ninth sensing signals;
providing control signals to switch all the power switches in an OFF state if the presence of possible over-currents is determined.

15. A MV switching device, according to claim 5, further comprising a controller to execute the following steps:
I). providing control signals to switch all the power switches in an OFF state;
II). executing a second fault determination procedure;
III). providing control signals to switch one selected switch in an ON state and to maintain all the remaining power switches in an OFF state;
IV). executing said second fault determination procedure;
V). providing control signals to switch the selected switch in an OFF state;
VI). if no faults are identified, repeating the previous steps iii)-v) for another selected switch, which has not already been selected, during the execution of said fault determination method; or
VII). terminating said fault determination method, when all the power switches have been selected once;
said second fault determination procedure comprising the following steps:
acquiring at least said first, second, third, seventh, and eighth sensing signals;
identifying possible faults at said power switches and/or at said excitation windings on the base of at least said first, second, third, seventh, and eighth ninth sensing signals;

if no faults are identified, acquiring said fourth, fifth, sixth and tenth sensing signals;

identifying possible faults at said power switches and/or at said excitation windings on the base of said fourth, fifth, sixth and tenth sensing signals.

16. A power drive circuit for a MV switching device, said switching device comprising an electromagnetic actuator for actuating electric contacts of said switching device and power supply means for supplying electric power to said electromagnetic actuator, said power drive circuit comprising:

a first input terminal and a second input terminal electrically connectable to said power supply means and establishing a voltage Vc between the first and second input terminals;

at least a first output terminal and a second output terminal electrically connectable to at least an excitation winding of said electromagnetic actuator;

a first circuit branch, which is electrically connected between said first and second input terminals and comprises said first output terminal, said first circuit branch comprising a first circuit branch portion between said first input terminal and said first output terminal, which comprises a first power switch configured to allow/block the flow of a current along said first circuit branch portion, and a second circuit branch portion between said first output terminal and said second input terminal, which comprises a second power switch configured to allow/block the flow of a current along said second circuit branch portion;

a first auxiliary circuit in parallel with the first circuit branch and connected to the first output terminal, and including a voltage divider to present a voltage at the first output terminal that is 10-90% of Vc when the first and second power switches are blocking the flow of current;

a second circuit branch, which is electrically connected between said first and second input terminals and comprises said second output terminal, said second circuit branch comprising a third circuit branch portion between said second output terminal and said second input terminal, which comprises a third power switch configured to allow/block the flow of a current along said third circuit branch portion, and a fourth circuit branch portion between said first input terminal and said second output terminal, which comprises a fourth power switch configured to allow/block the flow of a current along said fourth circuit branch portion;

a second auxiliary circuit in parallel with the second circuit branch and connected to the second output terminal, and including a voltage divider to present a voltage at the second output terminal that is 10-90% of Vc when the third and fourth power switches are blocking the flow of current;

wherein it comprises:

first sensing means configured to provide first sensing signals indicative of the current flowing along said first circuit branch; and second sensing means configured to provide second sensing signals indicative of the current flowing along said second circuit branch.

17. A power drive circuit for a MV switching device, said switching device comprising an electromagnetic actuator for actuating electric contacts of said switching device and power supply means for supplying electric power to said electromagnetic actuator, said power drive circuit comprising:

a first input terminal and a second input terminal electrically connectable to said power supply means and establishing a voltage Vc between the first and second input terminals;

a first output terminal, a second output terminal and a third output terminal electrically connectable respectively to a first excitation winding, a second excitation winding and a third excitation winding of said electromagnetic actuator;

a first circuit branch, which is electrically connected between said first and second input terminals and comprises said first output terminal, said first circuit branch comprising a first circuit branch portion between said first input terminal and said first output terminal, which comprises a first power switch configured to allow/block the flow of a current along said first circuit branch portion, and a second circuit branch portion between said first output terminal and said second input terminal, which comprises a second power switch configured to allow/block the flow of a current along said second circuit branch portion;

a first auxiliary circuit in parallel with the first circuit branch and connected to the first output terminal, and including a voltage divider to present a voltage at the first output terminal that is 10-90% of Vc when the first and second power switches are blocking the flow of current;

a second circuit branch, which is electrically connected between said first and second input terminals and comprises said second output terminal, said second circuit branch comprising a third circuit branch portion between said second output terminal and said second input terminal, which comprises a third power switch configured to allow/block the flow of a current along said third circuit branch portion, and a fourth circuit branch portion between said first input terminal and said second output terminal, which comprises a fourth power switch configured to allow/block the flow of a current along said fourth circuit branch portion;

a second auxiliary circuit in parallel with the second circuit branch and connected to the second output terminal, and including a voltage divider to present a voltage at the second output terminal that is 10-90% of Vc when the third and fourth power switches are blocking the flow of current;

a third circuit branch, which is electrically connected between said first and second input terminals and comprises said third output terminal, said third circuit branch comprising a fifth circuit branch portion between said third output terminal and said second input terminal, which comprises a fifth power switch configured to allow/block the flow of a current along said fifth circuit branch portion, and a sixth circuit branch portion between said first input terminal and said third output terminal, which comprises a sixth power switch configured to allow/block the flow of a current along said fourth circuit branch portion;

a third auxiliary circuit in parallel with the third circuit branch and connected to the third output terminal, and including a voltage divider to present a voltage at the third output terminal that is 10-90% of Vc when the fifth and sixth power switches are blocking the flow of current;

wherein it comprises:

first sensing means configured to provide first sensing signals indicative of a current flowing along said first circuit branch;

second sensing means configured to provide second sensing signals indicative of a current flowing along said second circuit branch;

seventh sensing means configured to provide seventh sensing signals (D7) indicative of the current flowing along said third circuit branch.

18. A MV switching device, according to claim 2, wherein said power drive circuit comprises third sensing means configured to provide third sensing signals indicative of the current flowing along said excitation winding.

19. A MV switching device, according to claim 2, wherein said power drive circuit comprises:

fourth sensing means configured to provide fourth sensing signals indicative of a voltage at said first output terminal;

fifth sensing means configured to provide fifth sensing signals indicative of a voltage at said second output terminal;

sixth sensing means configured to provide sixth sensing signals indicative of a voltage between said first and second input terminals.

20. A MV switching device, according to claim 3, wherein said power drive circuit comprises:

fourth sensing means configured to provide fourth sensing signals indicative of a voltage at said first output terminal;

fifth sensing means configured to provide fifth sensing signals indicative of a voltage at said second output terminal;

sixth sensing means configured to provide sixth sensing signals indicative of a voltage between said first and second input terminals.

* * * * *